United States Patent
Farlow et al.

(10) Patent No.: US 8,505,178 B2
(45) Date of Patent: Aug. 13, 2013

(54) ADJUSTABLE SUPPORT TOOLING APPARATUS

(75) Inventors: Douglas T. Farlow, San Diego, CA (US); Thomas A. Gordon, Poway, CA (US)

(73) Assignee: Production Solutions, Inc., Poway, CA (US)

( * ) Notice: Subject to any disclaimer, the term of this patent is extended or adjusted under 35 U.S.C. 154(b) by 667 days.

(21) Appl. No.: 12/473,925

(22) Filed: May 28, 2009

(65) Prior Publication Data

US 2009/0295053 A1    Dec. 3, 2009

Related U.S. Application Data

(60) Provisional application No. 61/057,600, filed on May 30, 2008.

(51) Int. Cl.
*B25B 27/14* (2006.01)
*B25B 1/24* (2006.01)
*B25B 5/16* (2006.01)
*B23Q 7/00* (2006.01)
*H05K 3/30* (2006.01)
*B23K 37/00* (2006.01)
*B23Q 1/00* (2006.01)

(52) U.S. Cl.
USPC .............. 29/281.1; 29/832; 29/559; 269/266; 228/44.3

(58) Field of Classification Search
USPC ............... 29/281.1, 832, 830, 559; 269/29, 269/37, 266; 228/44.3, 49.5, 103
See application file for complete search history.

(56) References Cited

U.S. PATENT DOCUMENTS

| 4,032,103 | A |   | 6/1977  | Ehrichs |
| 4,600,231 | A |   | 7/1986  | Sickles |
| 4,805,887 | A | * | 2/1989  | Ray .................................. 269/21 |
| 5,218,753 | A |   | 6/1993  | Suzuki et al. |
| 5,625,941 | A |   | 5/1997  | Ozawa |
| 5,841,617 | A |   | 11/1998 | Watkins et al. |
| 5,897,108 | A |   | 4/1999  | Gordon et al. |
| 5,984,293 | A | * | 11/1999 | Abrahamson et al. ........ 269/266 |

(Continued)

FOREIGN PATENT DOCUMENTS

| FR | 2629055 A1 | 9/1989 |
| GB | 2354505 A  | 3/2001 |

OTHER PUBLICATIONS

Notification of Transmittal of the International Search Report and the Written Opinion of the International Searching Authority, the International Search Report, and the Written Opinion dated Jul. 16, 2009 for corresponding International Patent Application No. PCT/US2009/045599 filed May 29, 2009, 8 pages.

*Primary Examiner* — Lee D Wilson
*Assistant Examiner* — Alvin Grant
(74) *Attorney, Agent, or Firm* — Lewis and Roca LLP

(57) ABSTRACT

A system and method for manufacturing that provides for adjustable support of work pieces such as printed circuit boards includes an edge rail system having first and second edge rails, with at least one of the edge rails being adjustable, allowing the width of the system to be adjusted to accommodate various widths of work pieces. It also includes a set of support strips for supporting a lower side of the work pieces and a means for dynamically adjusting spacing of support strips to adjust to the width of the edge rail system.

10 Claims, 33 Drawing Sheets

(56) References Cited

U.S. PATENT DOCUMENTS

| | | | |
|---|---|---|---|
| 6,012,568 A | 1/2000 | Kane | |
| 6,190,997 B1 | 2/2001 | Becker et al. | |
| 6,264,187 B1 * | 7/2001 | Hertz et al. | 269/266 |
| 6,394,782 B1 | 5/2002 | Grassi | |
| 6,695,298 B1 * | 2/2004 | Hertz et al. | 269/266 |
| 6,898,838 B2 | 5/2005 | Gordon | |
| 7,160,392 B2 | 1/2007 | Shang et al. | |
| 7,311,302 B1 | 12/2007 | Farlow et al. | |
| 7,758,028 B1 * | 7/2010 | Farlow et al. | 269/21 |
| 7,963,511 B2 * | 6/2011 | Meda | 269/37 |
| 8,234,780 B2 * | 8/2012 | Harvilchuck et al. | 29/832 |
| 2002/0007789 A1 | 1/2002 | Doyle et al. | |

* cited by examiner

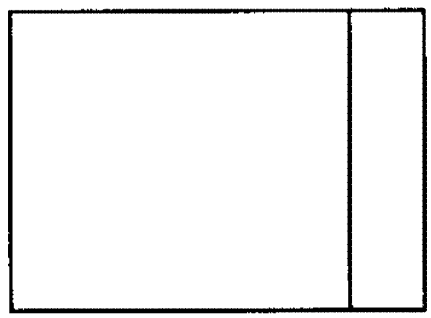
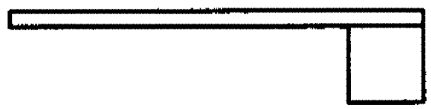
Blade
FIG. 6
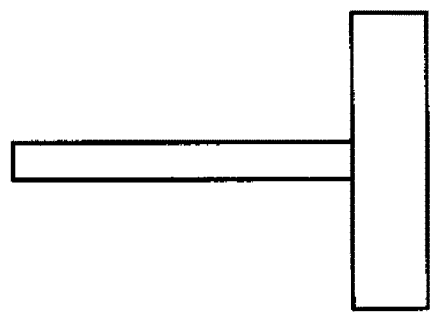
Pin

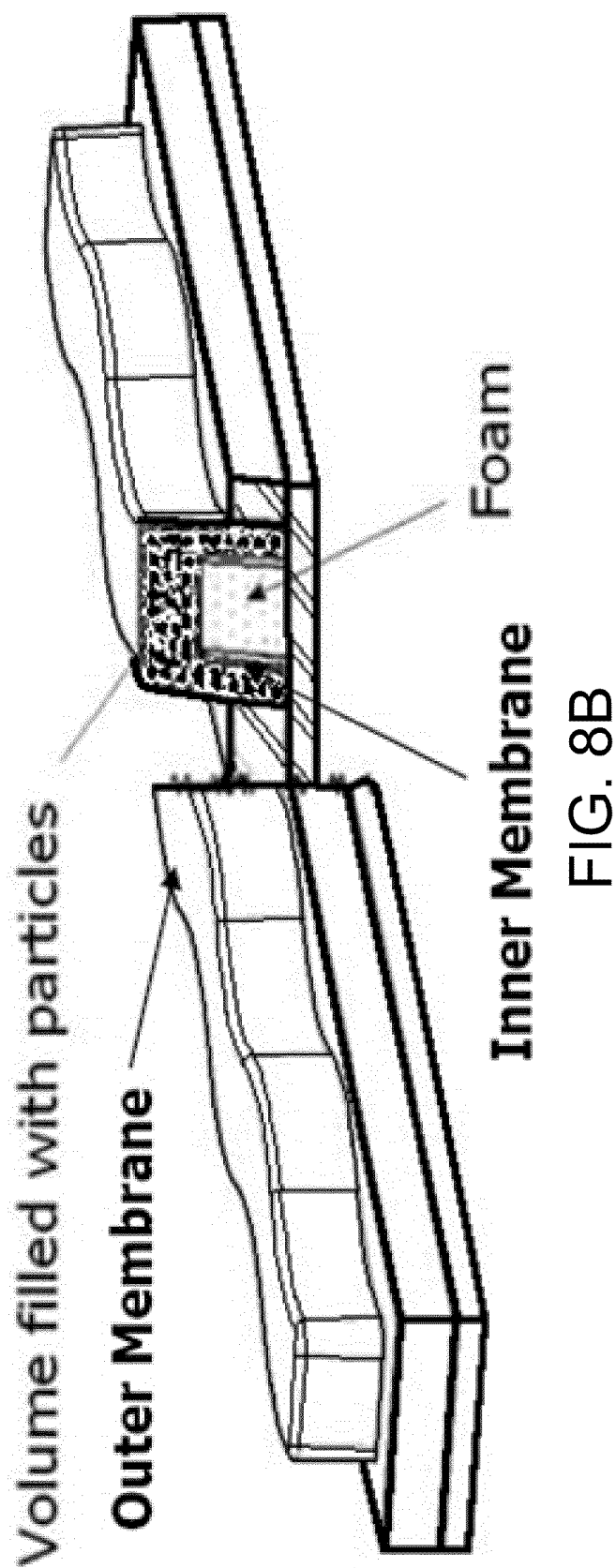

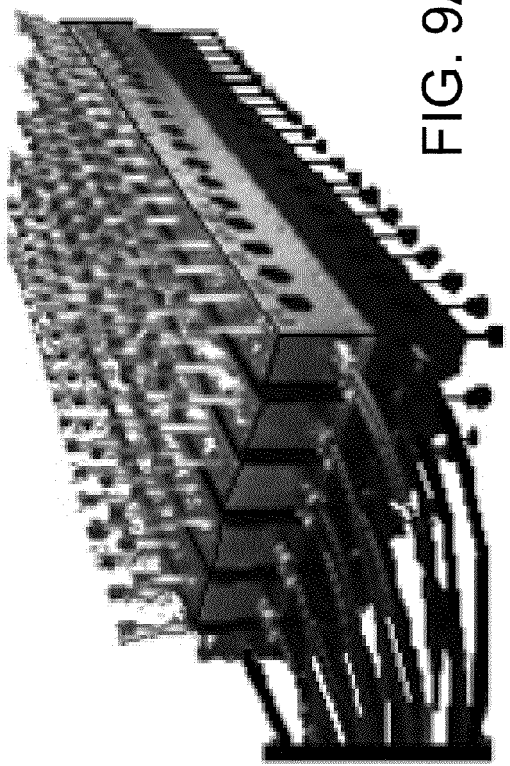
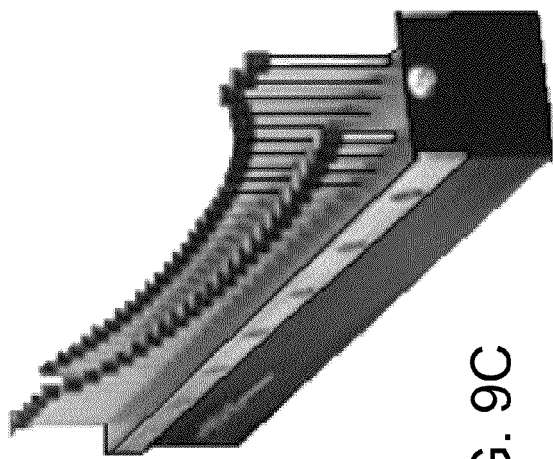
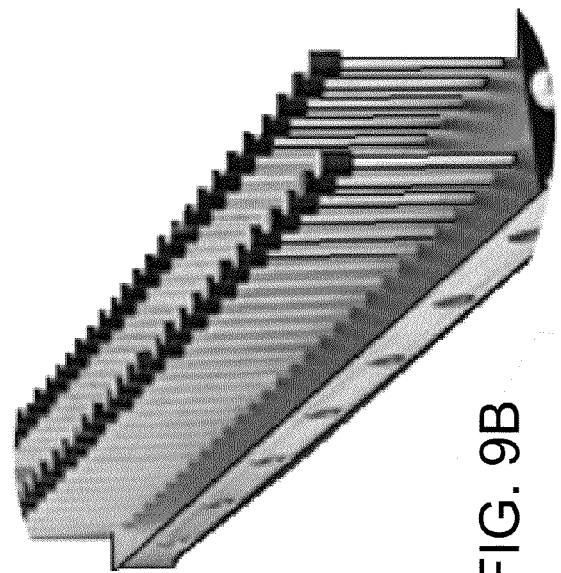
FIG. 9A
FIG. 9C
FIG. 9B

ADJUSTABLE SUPPORT TOOLING APPARATUS

CROSS-REFERENCE TO RELATED APPLICATIONS

This application claims priority to our U.S. Provisional Patent Application Ser. No. 61/057,600, filed May 30, 2008, the entirety of which is incorporated by reference herein.

BACKGROUND OF THE INVENTION

1. Field of the Invention

The present invention relates to a system for dynamically providing adjustable support for work pieces and, more specifically, to an adjustable system for providing support for printed circuit boards or other substrates typically having components mounted on one side during installation of other components on the other side.

2. The Prior Art

There are many operations within the manufacturing environment that require work-pieces to be well supported while operations are being performed on it. This is especially true where the work-piece itself is made from flexible materials or where the work-piece is flexible due to its design such as where it is thin or its length or width make it flexible. Other work-pieces may have an irregular surface such as the surface of a printed circuit board (PCB) that has components installed on one side and require additional operations to be performed on its opposite side during its assembly.

Within electronic assembly operations, and especially within the surface mount electronic manufacturing industry, most operations performed on PCB substrates require proper support that keeps the work-piece flat and level. Among them are printing, glue dispensing, epoxy encapsulation, pick-and-place, inspection and reflow.

There are two operations within electronic assembly where substrate support currently has had its strongest demand. They are "printing", whereby a substrate has a stencil or screen brought near the PCB substrate, the stencil or screen having apertures corresponding to the land pattern on the PCB, and whereby solder paste is then wiped across the stencil or screen with a squeegee that deposits paste onto the PCB substrate's individual lands, so that when the stencil or screen is lifted away, the paste remains on the PCB substrate's lands; and "pick-and-place" operations that are essentially robotic placement of components onto the PCB substrate, those components having pin-outs that are placed onto the appropriate lands of the PCB substrate.

These operations have had strong demand for underside support because pressure is applied to the top surface of the substrate as operations are performed to its top-side. Other operations may need support simply to keep substrates flat and level.

PCB substrate support has a long history, especially with the inception of surface mount technologies. Initially, printing of solder paste was done by individual deposition onto substrate lands, but the industry quickly adopted techniques from the silkscreen printing industry. Here, one could apply paste through a stencil onto the lands with a single pass of a squeegee. Because the squeegee had to be applied with a fair amount of pressure, the substrate had to be supported underneath to prevent the PCB from flexing.

When components were placed onto the substrate, the PCB might bounce, and even though the pressures were lower than squeegee pressures by an order of magnitude, they too required support during this operation.

To facilitate underside substrate support virtually all printing and pick-and-place operations adopted the use of a lifting table with support articles strategically placed onto the table that would then lift up and meet the substrate prior to the operations commencing. This technique is still in use today, having become even more critical when electronic assemblies started placing components on both sides of the PCB substrate.

BRIEF SUMMARY OF THE INVENTION

This patent discloses and claims a useful, novel, and unobvious invention for providing adjustable support for work pieces and, more specifically, to an adjustable system for providing support for printed circuit boards or other substrates typically having components mounted on one side during installation of other components on the other side.

In automated assembly process, printed circuit boards (PCBs) are typically shuttled to machines that provide assembly operations by means of an integrated conveyor system. Such integrated conveyor systems typically have a fixed front rail, and an adjustable rear rail to handle different sizes of work pieces. At work stations, support tooling supports the work pieces. Preferably the support tooling is adjustable to compensate for runs of different printed circuit boards.

In order to rapidly change from one run to another of PCBs, the present invention provides for dynamically adjustable placement of the support tooling, in response to changing sizes of PCBs being run. Combined with dynamically adjustable support tooling, this provides for changeover from one PCB batch to another in minutes, as compared to the hours it would take otherwise.

BRIEF DESCRIPTION OF THE DRAWINGS

FIG. 6 is a diagram showing exemplary Pins and Blades for Support Tooling;

FIGS. 8A and 8B are diagrams showing exemplary Bean Bags Support Tooling;

FIGS. 9A, 9B, and 9C are diagrams showing perspective views of exemplary Grid Lok™ Support Tooling;

DETAILED DESCRIPTION

Initial Processing

Figure 1:
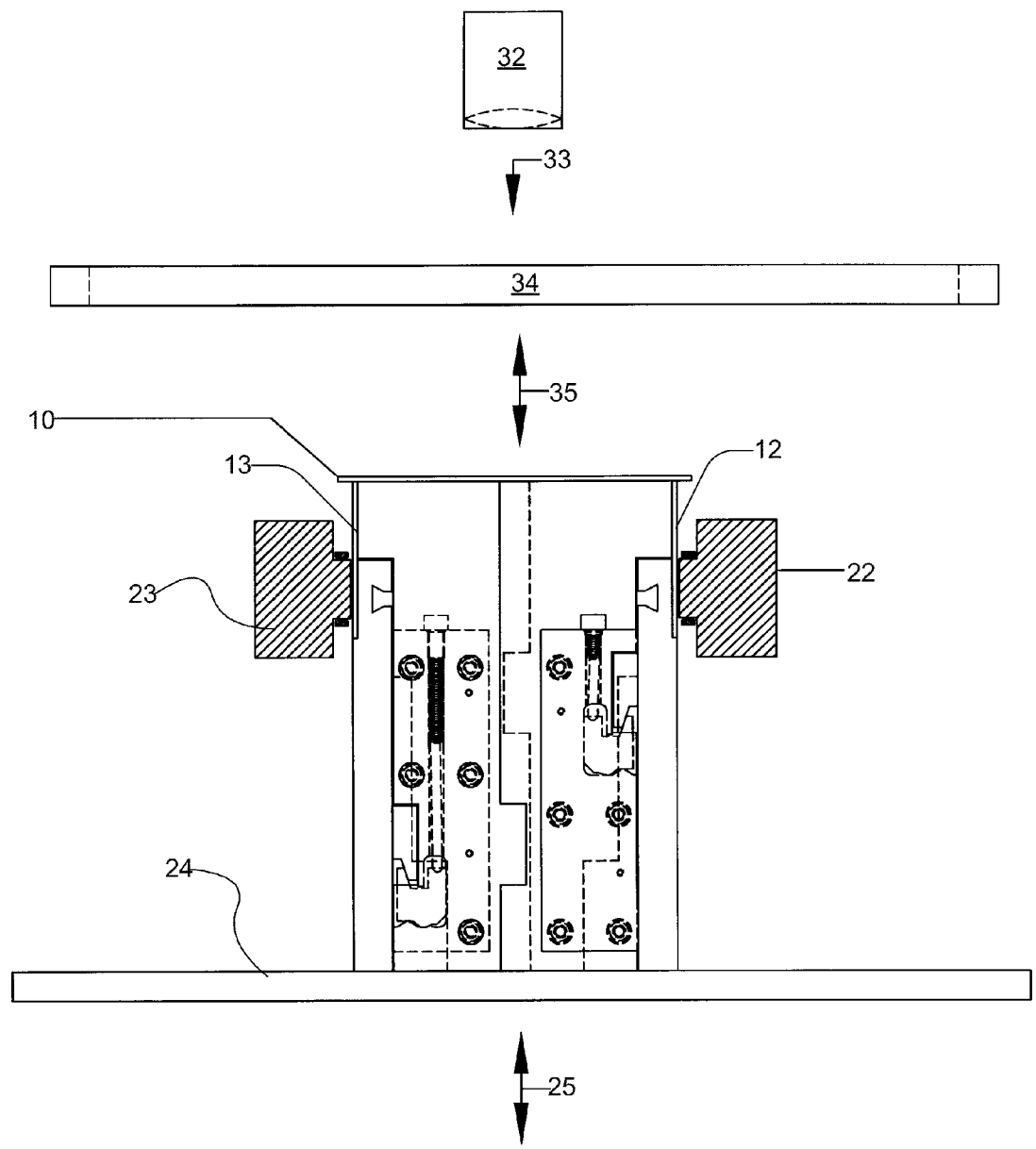
FIG. 1 is a diagram illustrating an exemplary integrated conveyor system utilizing a Vacuum Box for substrate printing.

Often, a PCB substrate or work-piece starts off with both sides having a flat surface. In this instance, the work-piece merely needs to lay on a flat surface while operations are being performed on the first side. Underside support tooling can be used to bring the work-piece up to its proper height with the support points all at the same height.

At the same time, these substrates may also be supported by rails as described below with support tooling still being utilized on the underside.

Batch Processes

Batch processes are processes where an operator places a work-piece in its work-piece holder, as opposed to where a conveyor system moves the work-piece along and where the machine, typically through sensors, automatically senses the position of the work-piece and automatically holds its position in a work-piece holder while operations are performed on it before releasing it and automatically sending it along to a subsequent operation.

For batch processes within the electronic assembly process, PCB substrates are typically held by two rails that support the substrate on at least two opposite edges. This becomes even more critical as processes are performed to its second side with components that were previously installed on the first side hanging below the supporting rails at various levels.

Tooling pins that align with tooling holes on the substrate are often employed to keep the substrate properly positioned and from moving, as well as snuggers that grip the PCB by its edges. They can be used individually or in combination with each other. For tooling pins to be most effective, they should typically be the same size as the tooling holes on the PCB and are commonly no higher than the thickness of the PCB, depending on the operation the board is undergoing. Snuggers are often spring loaded and supply a sufficient force against the substrate's edges to keep it from moving. They, too, have features that rarely if ever protrude above the top surface of the substrate.

Tooling pins and snuggers are often mounted directly to the rails that support the PCB. Within the confines of the two rails, and typically under the PCB substrate, underside tooling is often placed that supports the substrate so that it does not flex while undergoing its assembly operations.

Automated Assembly Processes

In automated assembly processes, a PCB substrate is typically shuttled to machines that perform these operations by means of a conveyor system. Conveyor systems for electronic assembly have been standardized under the "*Surface Mount Equipment Manufacturer's Association*" (SMEMA) standards. In general, conveyor systems have a fixed front rail, an adjustable rear rail, a specific height off of the floor, a communications protocol that allows these systems to communicate with the various machines that perform these operations via computer systems, and move left to right. Conveyor systems are typically modularized and are also typically belt driven.

The rails of the conveyor are then adjusted to the width of the PCB substrate, its length typically being the direction of travel and typically being the longer of the two dimensions. While substrates can be virtually any length and width and generally range in thicknesses from 0.010" to 0.125", depending on the design; length and width dimensions are commonly modularized so that they can fit within the confines of the conveyor system and machine work areas.

The machines that receive the substrates from the conveyors typically have an integrated conveyor that receives the incoming substrate prior to the performed operation, and after the operation sends the substrate onto a next conveyor that then shuttles the substrate to the next operation. At least part of the integrated conveyor system within the machine is typically used as the "work-piece" holder, that is, it holds the PCB substrate in place while it is undergoing either printing or pick-and-place or one of the other operations listed above. Typically, printing comes before pick-and-place, whereupon the substrate is reflowed in an oven, melting the individual solder paste deposits on the substrate lands into small monolithic "balls" of solder that attach the individual lands of the PCB substrate to the pin-outs of the components that sit on the lands. At this stage, many PCB substrates are then flipped over and the process is repeated with another round of printing, pick-and-place, and reflow on the substrate's opposite side.

Printing and pick-and-place operations are exacting operations and require the substrate to be well supported on the underside during the operations and made to be as flat and level (level to the machine's internal structures) as possible; otherwise, defects can be introduced, and once reflowed require costly rework or scrapping of the product since it will not perform properly without rework. In high volume production, scrapping is often required instead, as there is no cost benefit to reworking. The need to keep the substrate from flexing, and flat and level is especially true of printing, since a fair amount of force or "squeegee pressure" is required to force the solder paste through the stencil or screen apertures onto the substrate lands. Squeegee pressures depend on the size of the PCB substrate and typically range from a few to a dozen kilograms of force. Component placement pressures depend on the total pin-out surface area that is pressed into the paste for any given component, and can range from a few to several hundred grams of force. If the PCB substrate is not well supported and flat and level, the stencil or screen may have insufficient contact or gaps in contact with the substrate as the squeegee passes over it. For pick-and-place operations, substrates that are not well supported and flat and level may bounce with each placement, or may not have component pin-outs placed into the paste on all of the lands that are present on the substrate for any given component, or the component may be misaligned with the PCB substrate's land pattern for that component by the placement head. This is especially true where large components with high pin-out counts are used.

Types of Integrated Conveyor Systems—Printing

The conveyor system that is integrated into the various machines varies on the kind of operation that is being performed and the type of machine that it is. For printing, there are two basic types of integrated conveyor systems: one that is "open" allowing the substrate to be lifted above the conveyor system; and one that is "closed," that is, it has a thin upper lip that only allows the top surface of the substrate to be lifted substantially even with the top of the conveyor system. The thin upper lip is often called "over-the-top tooling". A third type employs the use of snuggers.

In the first instance, the conveyor straddles two lifting rails 12, 13 that are attached to a table 24 that then moves upward 25 as the substrate is brought into position by the conveyor (FIG. 1). There are any number of conventional means for the conveyor integrated with the machine to detect the presence of the substrate. For example, a light source (not shown) may be bounced off of the PCB 10 as it is moved into position, a light detection sensor senses its position, and stops the conveyor. The front and rear lifting rails 12, 13, which are attached to the table 24 and which have two sets of overlapping side plates that are attached to the front and rear lifting rails 12, 13, form a wall that roughly corresponds to the PCB's outline. The PCB 10 is then lifted up and out of the way of the conveyor system 22, 23 while vacuum is applied, the PCB 10 now forming the top of a "vacuum" box, with the table being the bottom of the box. A camera 32 will look down 33 and align the stencil apertures 34 to the lands of the substrate 10. A stencil or screen 34 may be brought near 35 the PCB substrate 10 and the printing operation commences, after which the stencil 34 is lifted away. The vacuum prevents the substrate 10 from lifting away with the stencil 34 and separates the solder paste from the stencil aperture walls onto the PCB's lands, since the PCB's lands have a greater surface area than the stencil walls for any given aperture. The table 24 with its lifting rails 12, 13 and side plates is then lowered with the substrate and the vacuum is shunted; bringing the PCB 10 back onto the conveyor belts, where the substrate 10 may then be shuttled to the next operation. Typical of this type of system is a machine made by MPM Corporation.

Figure 2:
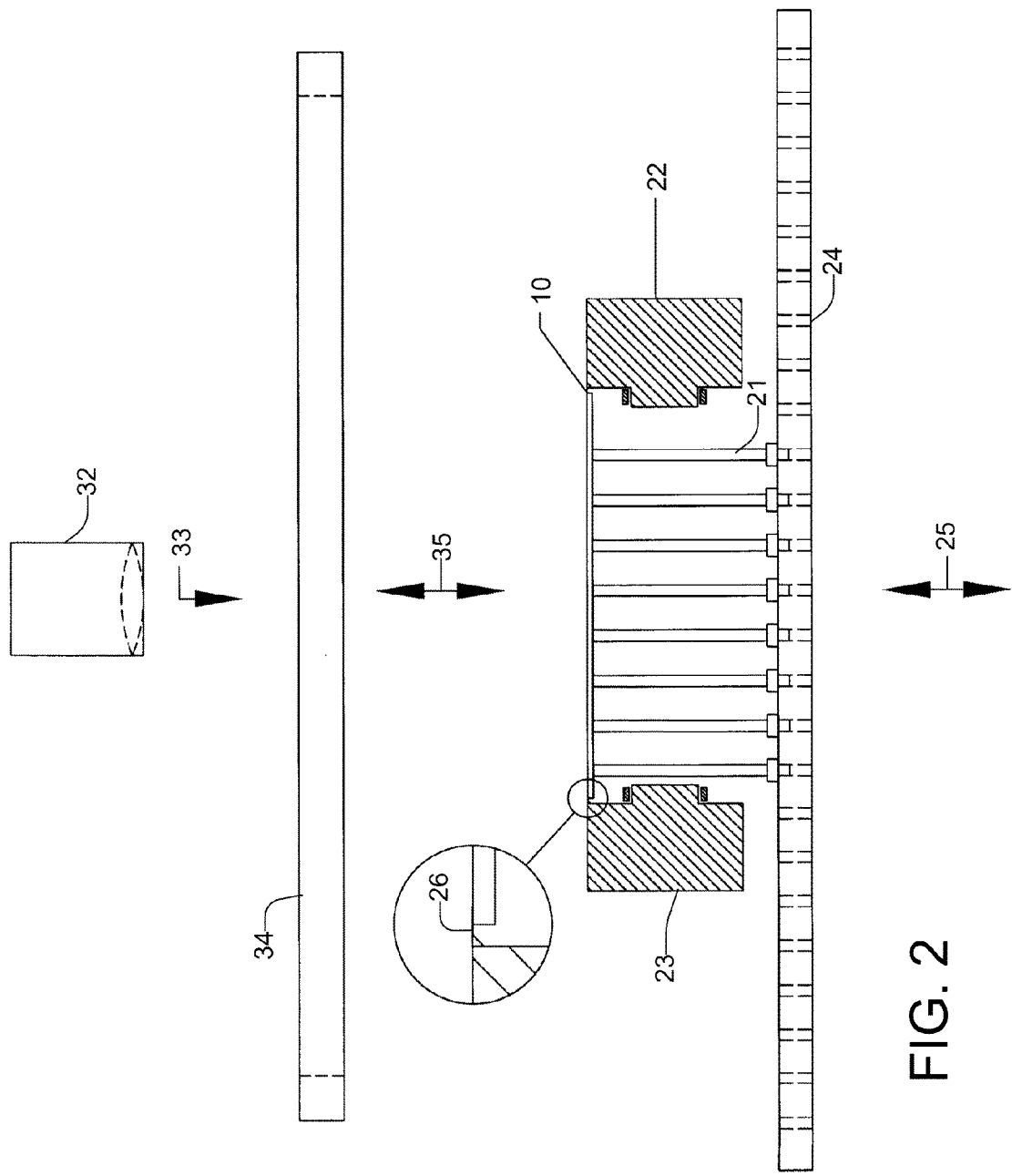
FIG. 2 is a diagram illustrating an exemplary integrated conveyor system utilizing Over-the-Top Tooling.

Many printers, however, operate with the PCB substrate 10 remaining in the integrated conveyor. The PCB 10 is moved in by the belts, stopped by sensor; and the table 24 lifts up 25 with support tooling 21 in place that lifts the PCB substrate 10 off of the conveyor belts and presses the substrate against a very thin upper lip 26 attached to the front 22 and rear 23 rails of the conveyor, holding the PCB 10 in place (FIG. 2). The lip 26 is typically a knife-like blade, thick at the attach point to the conveyor, but very thin where it engages the PCB 10 (typically on the order of a couple mils). Nothing typically protrudes above the height of the blades 26 so as not to interfere with the stencil or screen 34, allowing the stencil or screen 34 to come as close as possible to the surface of the PCB substrate 10. The stencil 34 is then brought near to the PCB substrate 10, and printing operations commence. After printing, the stencil 34 lifts 35 away and the table 24 with its support tooling lowers 25, allowing the substrate 10 to drop back onto the conveyor belts and then move on to the next operation.

In the first instance, the conveyor's rear rail 23 adjusts to the width of the PCB (the front conveyor rail 22 typically being fixed), as well as the rear rail 13 that lifts it upward and off of (above) the conveyor (the front lifting rail 12 being fixed).

In the second instance only the rear conveyor rail 23 is adjusted to the PCB width (the front conveyor rail 22 typically being fixed). The PCB 10 is held in place by the thin upper lips 26 of the conveyor when the table 24 lifts up 25 with the required support tooling 21, the support tooling 21 behaving like the lifting rails 12, 13 of the first instance.

Support tooling 21 (not shown) in the first instance is typically confined within the walls of the vacuum box. The front 12 and rear 13 lifting rails should also be considered support tooling. This also includes the side plates that make up the box which roughly corresponds to the PCB substrate's 10 perimeter. In the second instance support tooling 21 is merely mounted to the table 24 without lifting rails 12, 13 and the side plates that conform to the perimeter of the substrate 10.

In the first instance, the support tooling 12, 13 and side plates, and 21 (not shown) lifts the substrate 10 clear of the conveyor, in the second instance, the support tooling 21 lifts the PCB 10 with its top side even or just slightly under the top of the conveyor.

In both instances, however, the conveyor's rear rail 23 is adjusted to the width of the PCB 10 (in the first instance so is the rear lifting rail) and a table 24 moves up 25 with the required support tooling 21 attached to the table 24 that then supports the PCB 10 while under operation.

Figure 3:
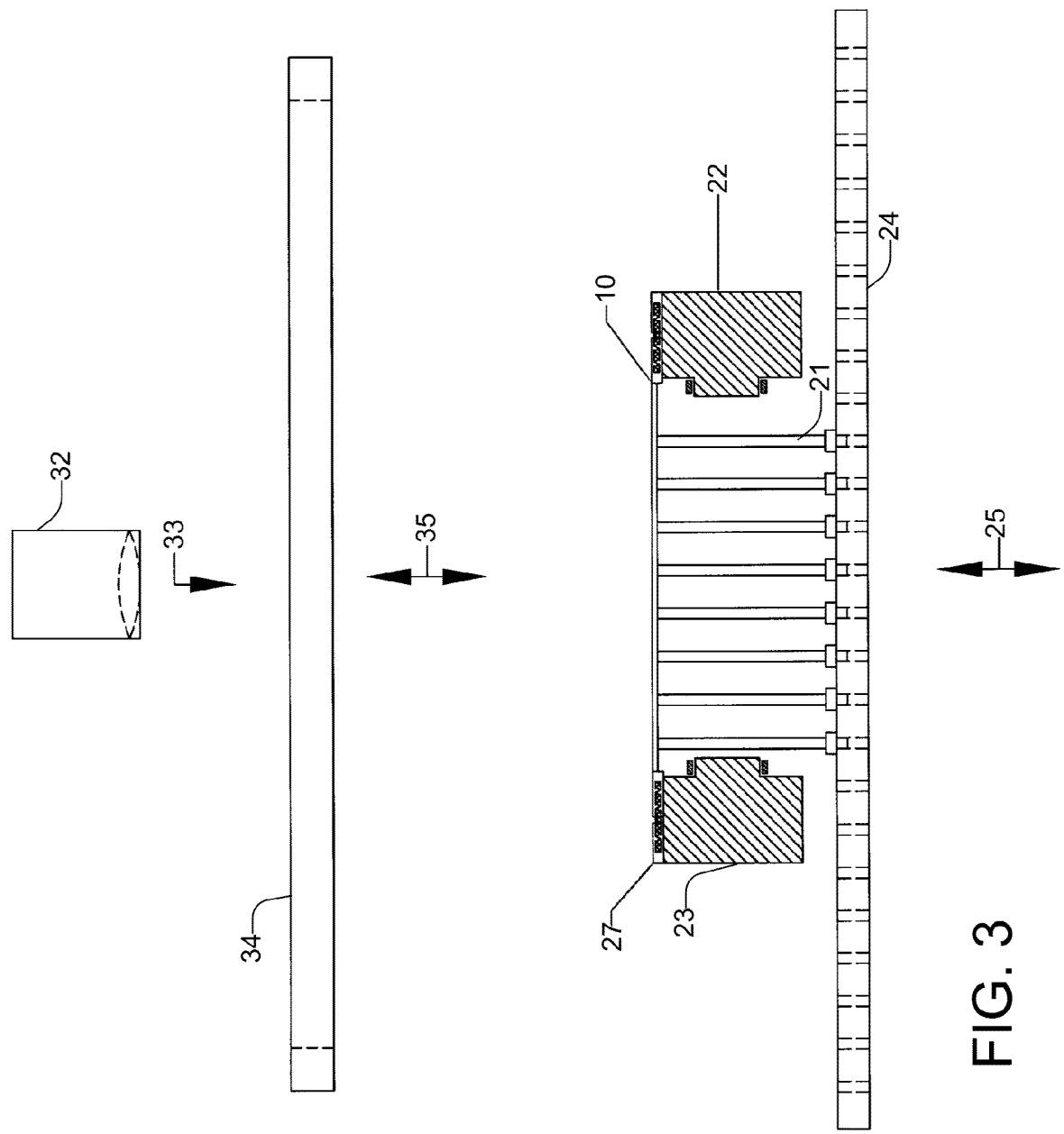
FIG. 3 is a diagram illustrating an exemplary integrated conveyor system utilizing Snuggers for substrate printing.

When snuggers 27 are used, they are often integrated with the conveyor rails 22, 23, and when the support tooling 21 lifts the PCB substrate 10 off of the conveyor belt, the snuggers 27 engage the length-wise edges of the PCB 10 (FIG. 3). These snuggers 27 typically do not protrude above the top surface of the substrate 10, so that there is no interference with a stencil or screen 34.

Typically, the table 24, when it moves upwards 25 and into position, cannot be pushed down easily, since it typically has to perform under the load applied by a squeegee as it forces solder paste through the apertures of the stencil or screen 34 when it is brought near the PCB substrate 10.

It is during set-up of a machine that support tooling 21 is registered to the underside of the substrate 10 and where a flattening tool or press plate may be set on top of the PCB 10 and across the conveyor that removes any PCB substrate 10 warpage prior to adjusting and "locking in" the support tooling's 21 height. This is typically accomplished by an over-sized flat plate (at least slightly larger than the size of the substrate) that is currently typically around ¼" thick. Having the press plate straddle the conveyor rails 22, 23 or the lifting rails 12, 13 allows for the substrate 10 to be made level with the machines internal structures.

Types of Integrated Conveyor Systems—Pick-and-Place

For pick-and place operations, the machine's integrated conveyor typically has a front 22 and rear 23 rail, with the front rail 22 typically fixed and the rear rail 23 adjustable.

In the case of a standard pick-and-place machine, the system will typically have the basic SMEMA scheme, since the table 24 is fixed. That is, the table 24 does not move around in the X or Y directions (it does still lift, however (Z-direction)). If the machine is a chip shooter, the table 24 will typically move around under the component placement head 36 to facilitate much faster component placement rates onto the PCB substrate 10 that is held in position. The placement head 36 typically also moves 37 in the X, Y and Z directions. While older machines could rotate the placement head 36 in 90° increments, more modern machines move in the Theta-direction in single degrees or smaller for angular placements.

Figure 4:
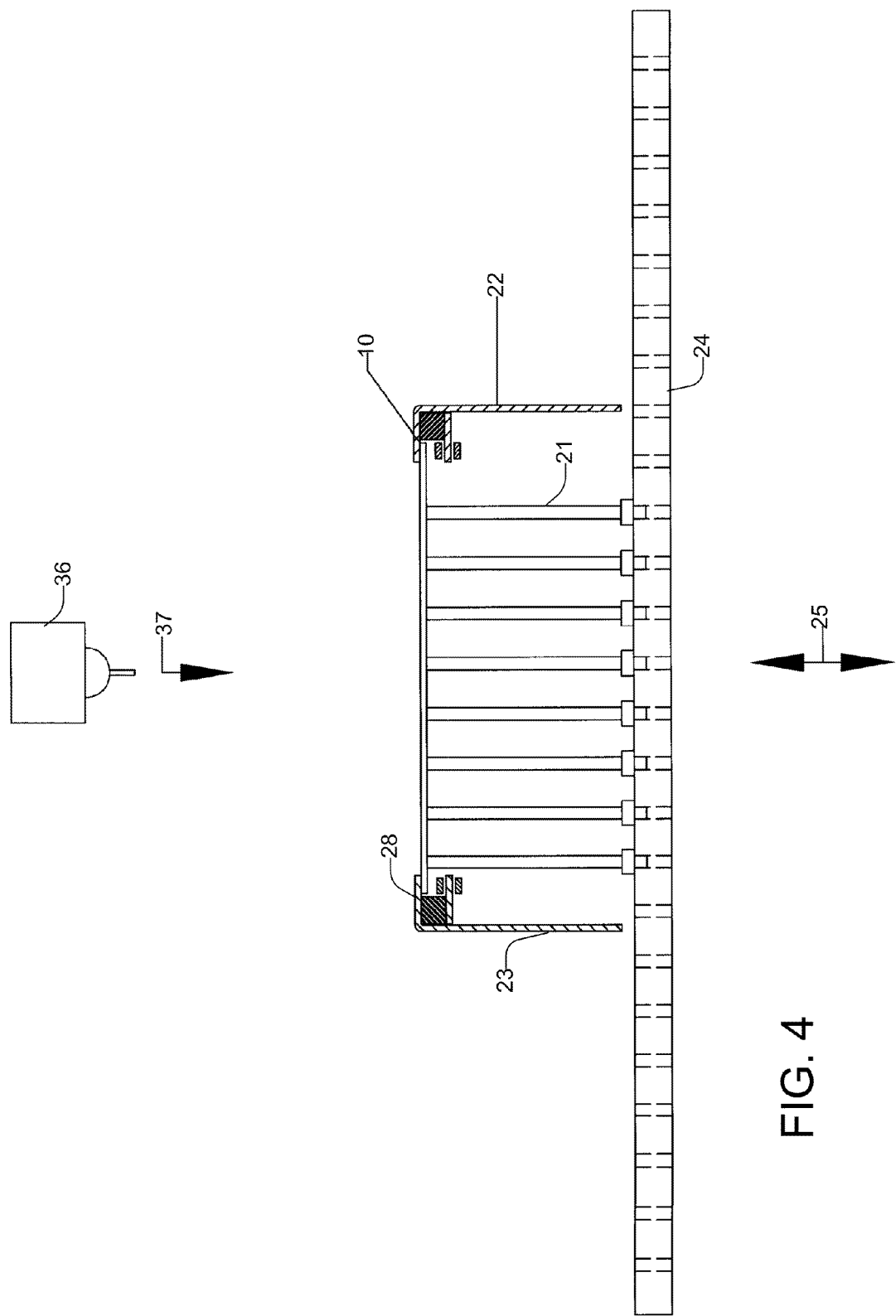
FIG. 4 is a diagram illustrating an exemplary integrated conveyor system utilizing an Upper Blade for Pick-and-Place.

In the first case, the conveyor is like the printing system with the upper lip, that is, it has the blades 28, but the blades are not required to be nearly as thin, nor does it require that nothing protrude above the blades 26 (FIG. 4). The table 24, with its support tooling 21, again lifts up and lifts the PCB 10 off of the conveyor belts and presses it against the upper lip 28, which holds it in place during pick-and-place operations. Standard sensors are typically used to sense when the PCB substrate 10 is in position prior to the table 24 and support tooling 21 elevation. There may also be "stops" that lift into position to keep the PCB substrate 10 accurately positioned along its direction of travel. These stops may also comprise snuggers 27. In this case, the table 24 may or may not be rigidly held in its Z-direction, since it is under significantly less load during the placement of components.

With chip-shooters, the table 24 still lifts up with support tooling 21, but the table 24 along with its integrated conveyor system with the upper lip moves around, and therefore the PCB substrate 10 has to be held in place with greater rigidity. Snuggers 27 are often employed in this situation. Snuggers 27 move into position by mechanical means and snug up against the PCB substrate 10 along its edges. They may come in along the conveyor rails 22, 23 and against the length-wise edges of the substrate 10 as in the printing system described above, or they may come in along the width-wise edges of the PCB substrate 10 like the stops described above.

Figure 5:
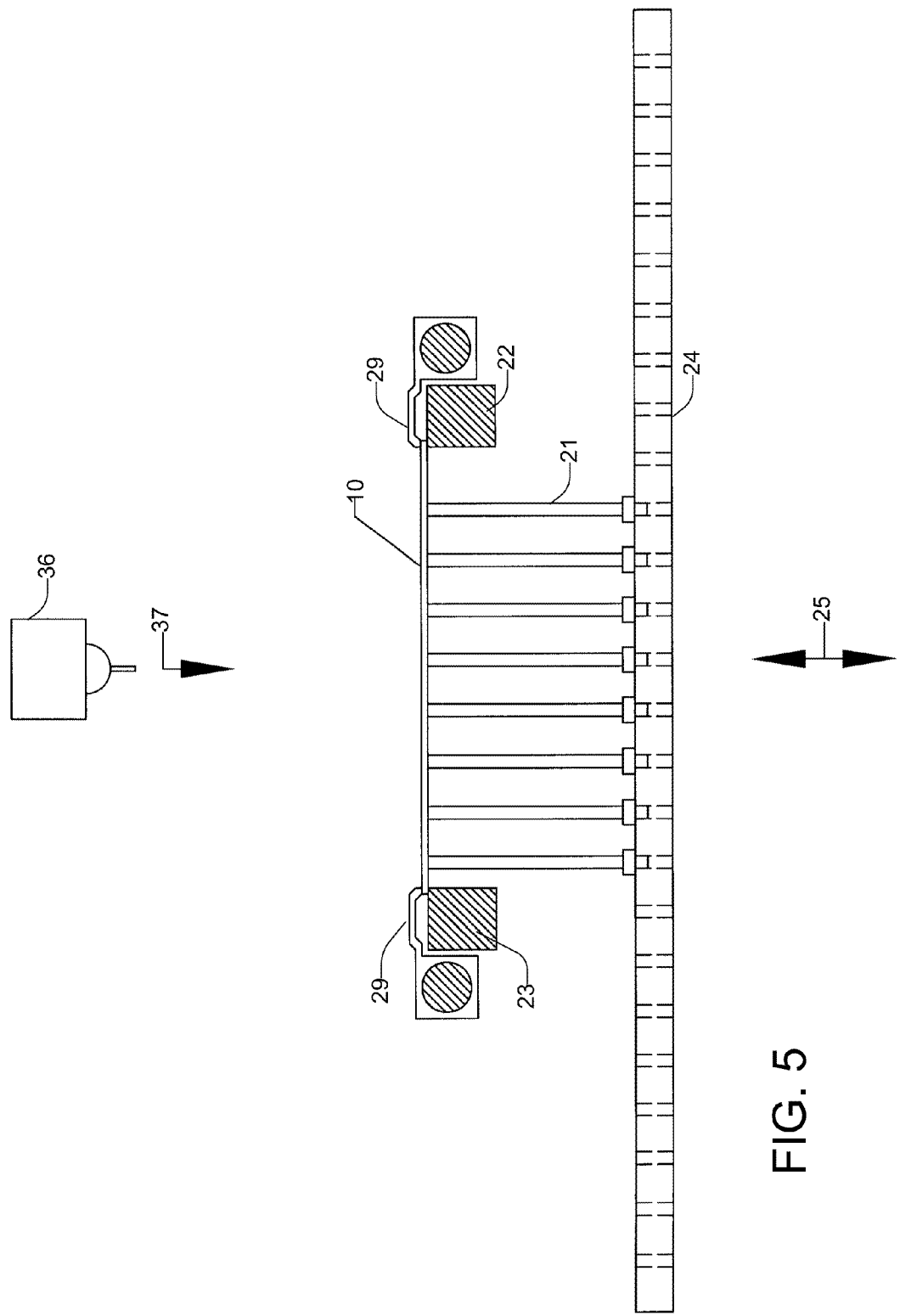
FIG. 5 is a diagram illustrating an exemplary integrated conveyor system utilizing Finger Clamps for Pick-and-Place.

Finger-like clamps 29 may also be used, and can be described as a series of individual clamps along the opposite lengths of the PCB substrate 10 which grip the PCB substrate 10 while under operation (FIG. 5). The conveyor moves the PCB substrate 10 to the finger clamps 29, and a push rod typically moves the PCB substrate 10 into position prior to clamping, since the finger clamping system is typically not belt driven. In this instance, the system is not technically a conveyor, but it works in tandem with the conveyor via the push rods.

In this instance, there are still front 22 and rear 23 rails which are adjusted to the PCB substrate's 10 width and which hold the PCB substrate 10 in position. There is also a lifting table 24 that has substrate support tooling 21 attached that keeps the PCB substrate 10 flat and level while under operation. In most instances, the front rail 22 is fixed, but with chip-shooters, that is not always the case. These clamping methods allow the table 24 to move with the PCB substrate 10 at high rates of speed without dislodging it while under operation.

Summary of Batch Processes and Automated Assembly Processes

It is difficult to describe each and every type of work-piece holding system available on the market today, even within one industry. Suffice to say that the most common elements are typically a front 22 and rear 23 rail (also 12, 13) that holds a work-piece 10 whether it is integrated with the conveyor system or not, and a table 24. Usually, one of the rails is moveable and one is fixed. The table 24 typically has support tooling 21 on it and normally lifts up 25 to engage the work-piece 10. A common scheme is that when the table 24 and support tooling 21 lifts up, the work-piece 10 is clamped in one of the manners described. Another common scheme is that the front 22 and rear 23 rails work in tandem with a clamping system.

For virtually all machines with integrated conveyor systems, the moveable rail(s) 23 and/or 22 of the integrated conveyor system are typically automated in its movements, that is, a motor(s) with a screw drive(s) is attached to the moveable rail(s) and a computer controls the distance between the rail(s) 22, 23 so that the substrate/work-piece 10 width can be accommodated by programming means. While this is true, some machines, especially some older machines have a hand crank that moves the conveyor rail(s) 22, 23 or is manually adjusted by hand.

Types of Support Tooling

PCB substrates 10 under printing and pick-and-place operations typically require underside support in order to keep them flat and level. This is true whether a PCB substrate 10 has components on one side or both. With components on a single side only, support tooling 21 merely has to come up to the underside surface of the PCB 10 at an even height. Since machines that perform these operations typically have lifting tables 24, the support tooling 21 is normally attached to the table 24 and as the table 24 lifts up 25, the support tooling 21 will engage the substrate 10 at its underside surface, keeping it from warping and minimizing or eliminating movement in the Z-direction. Pins and blades with magnetic bases (FIG. 6) may be used, or the table 10 can have a series of holes that the pins are moved into (FIGS. 2, 3, 4, 5). These pins typically have a flange that keeps them from dropping through the table 24. These pins are usually of a specific height that guarantees that they engage the PCB substrate 10 work piece as required. For operations that use a conveyor with an upper lip 26, 28, 29 attached to the conveyor rails 22, 23, the support tooling 21 is typically high enough to lift the PCB 10 off of the conveyor belts and press the substrate 10 against the upper lip 26, 28, 29, holding it in place.

For a PCB substrate 10 with components on both sides, the support tooling 21 typically must conform to the topography of the PCB substrate 10 that has components on a first side while operations are being performed on a second side. This has proved problematic in the past, and various schemes have been developed that allow for support in this instance.

If pins and/or blades of a standard height are utilized to support a PCB substrate 10 work piece, the pins and/or blades typically have to be placed under the PCB substrate 10 in locations where no components exist, often leaving large areas unsupported or under-supported. MPM has developed a system that will automatically place support pins at pre-programmed locations to facilitate this.

Pins can also be made adjustable in their height, or a plate is hogged out in regions where components exist on any given PCB substrate 10, and attached to the table 24 (which is time consuming and expensive). Moreover, pick-and-place machines 36 with moving tables (chip-shooters) often have weight limitations, since high inertial masses attached to the table 24 become problematic with high speed table movements.

Figure 7:
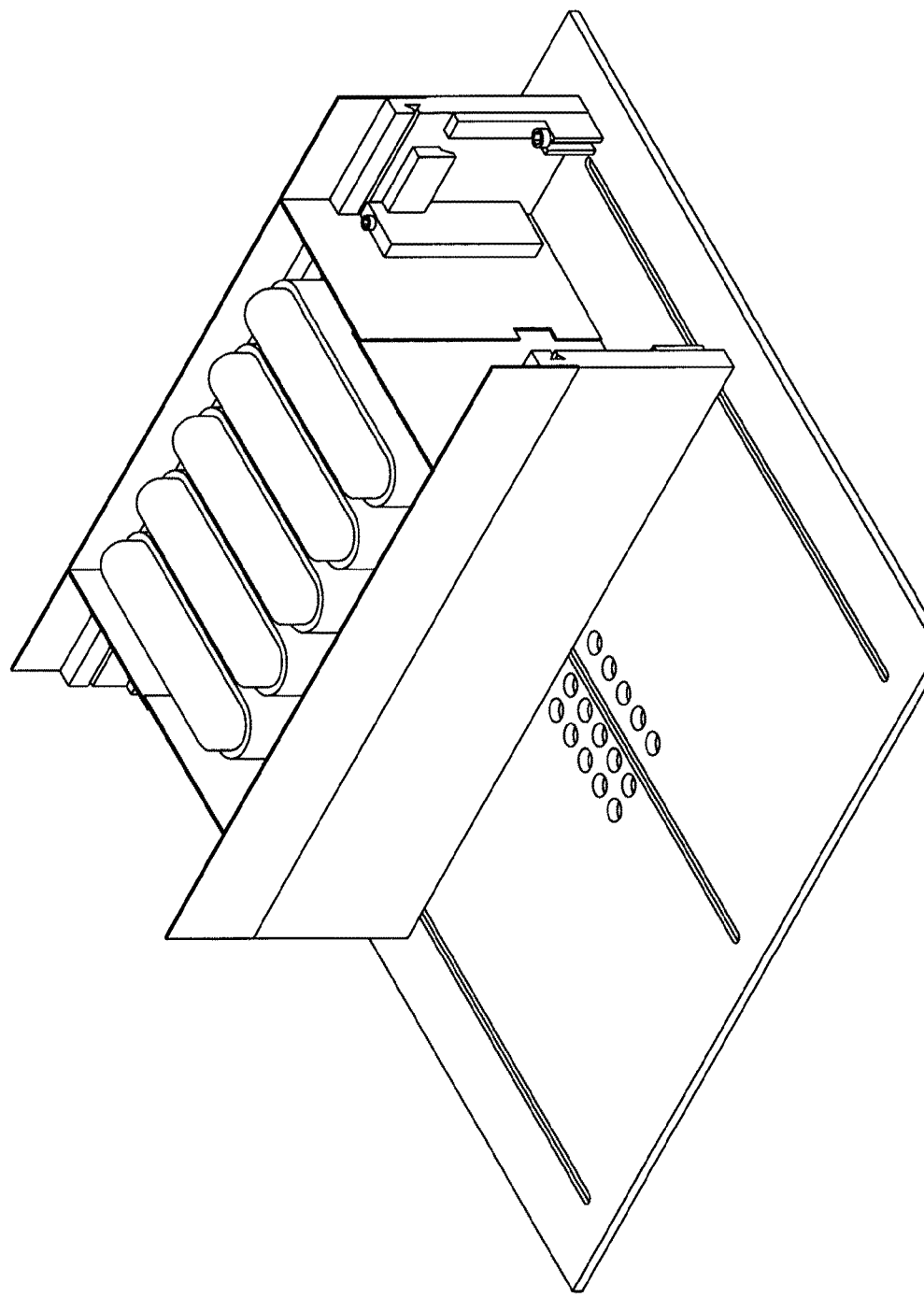
FIG. 7 is a diagram showing exemplary Gel-Flex™ Support Tooling.
Figure 8A:
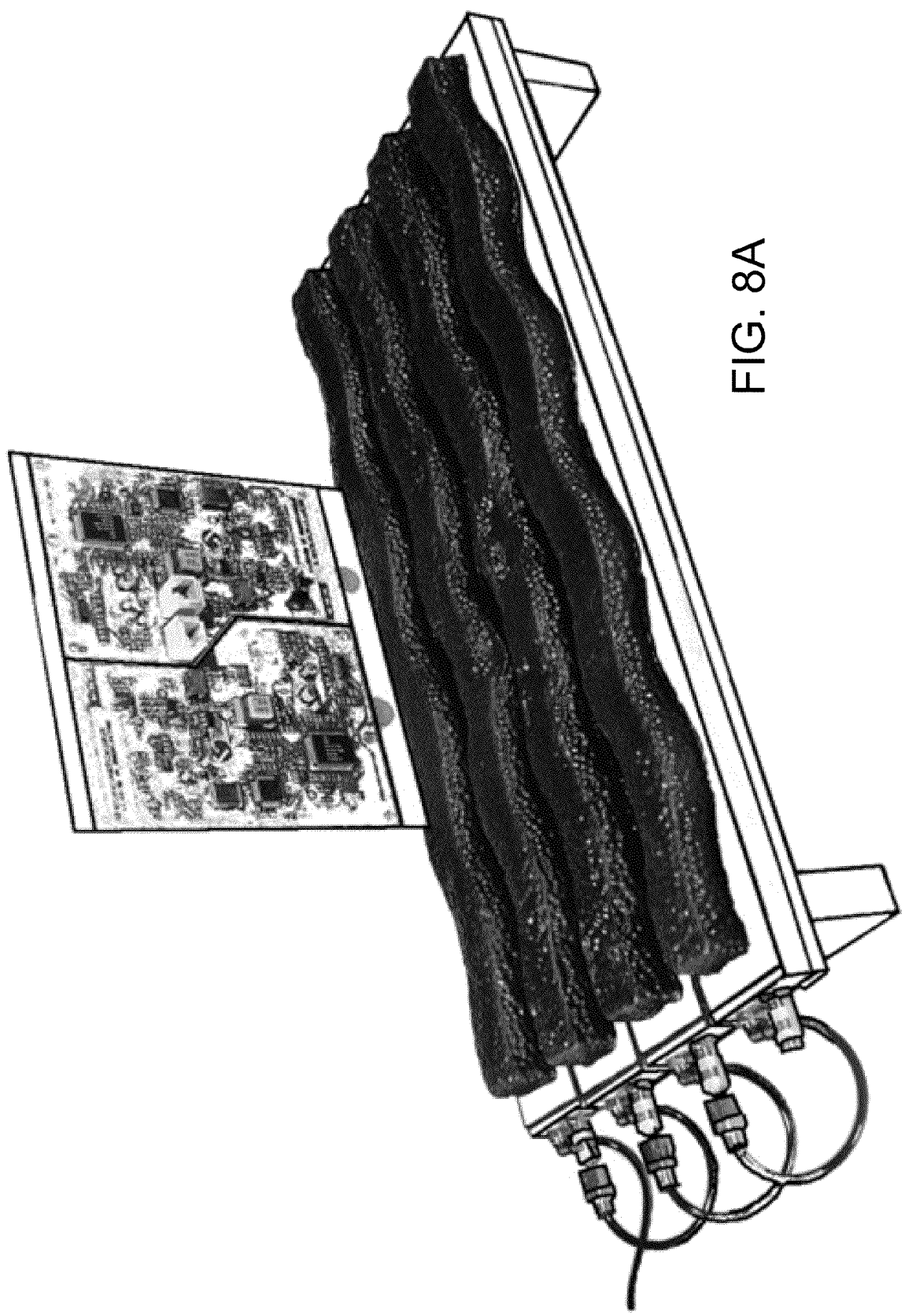

Other tooling support apparatuses have been developed that apply a more universal approach. Exemplary of these is MPM Corporation's Gel-Flex® shown in FIG. 7, currently available through Speedline Technologies, Inc. of Franklin, Mass., which is used with their vacuum box system. Others have developed bladders filled with beads that behave much like bean bags. One example of this is the VacuNest system available through Novatec SA as shown in FIGS. 8A and 8B. Often, these support tooling systems have their air extracted leaving the bean bag's shape relatively stable.

FIGS. 9A-C shows an exemplary Grid-Lok™ tooling support system currently available through Ovation Products of Bethlehem, Pa. (owned by DEK). DEK, also, makes a printer with a table where the pins are integral to the table and individual pins lift up by pneumatic means with each pin being individually programmable and locked in place.

Figure 10:
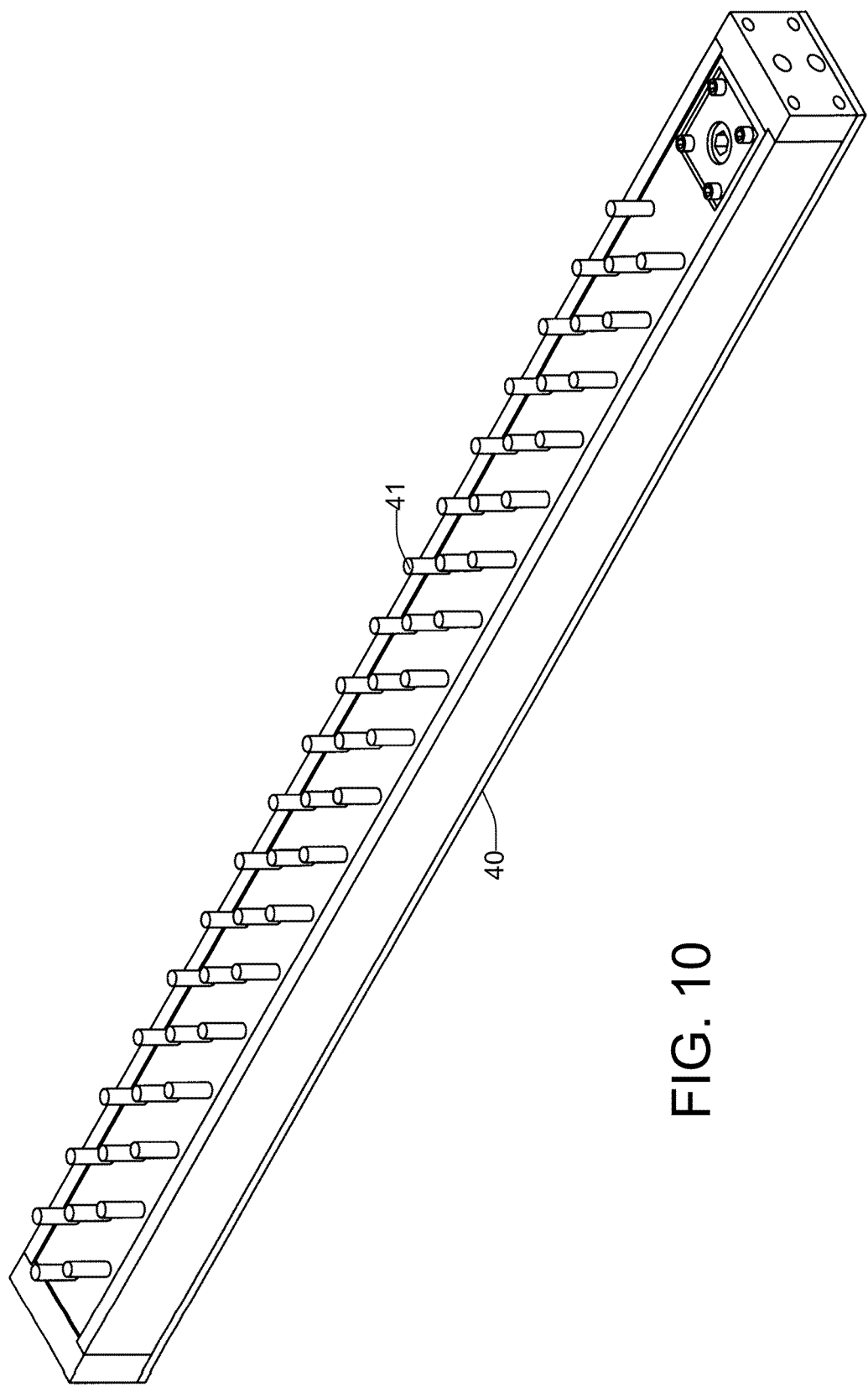
FIG. 10 is a diagram showing an isometric view of Red-E-Set Support Tooling.

FIG. 10 shows an exemplary Red-E-Set™ tooling support system from Production Solutions, Inc. of Poway, Calif. It comprises support strips 40 that have pins 41 that are locked into position by a series of plates. Portions of the Red-E-Set™ system are described more fully in U.S. Pat. No. 5,897,108 to Gordon et al. and U.S. Pat. No. 7,311,302 to Farlow, et al., incorporated herein by reference.

The Red-E-Set™ system will be used hereinafter as an exemplary tooling support apparatus to illustrate the present invention in the form of multiple Red-E-Set™ support strips 40. However, this is illustrative only, and other support tooling apparatuses are also within the scope of the present invention, including, but not limited to, the Gel-Flex®, VacuNest, and Grid-Lok™ systems described above. Furthermore, though the Red-E-Set™ is shown with mechanical means to lock and unlock its pins, it should be understood that other mechanisms, such as hydraulic, pneumatic, or electric may also be utilized in the present invention. Also, systems can be left unlocked and the pins may be pushed upwards by an upwardly biasing element such as a spring or foam, the downward force typically being less than the cumulative supporting force.

Only the DEK printing system that has pins integral to the table, with each pin being individually programmable and locked in place, is currently readily able to accommodate boards of various widths and lengths. Nevertheless, that system is expensive, programming the system takes time, and in today's manufacturing environment, change-over time and programming time can make or break a company's profit margin on any given job. Moreover, that system is not available to other printing or pick-and-place manufacturers.

DEK's Grid-Lok™ system and Production Solution's Red-E-Set™ system more easily allow quick change over, since they are both produced in strips of varying lengths that can be stacked next to each other with the pins locked into place as part of the set-up procedure. MPM's modular Gel-Flex™ system can do this as well, but they have been disinclined to make their system for other equipment manufacturers other than their own. This is a problem since there are literally hundreds of different pick-and-place machines and printers, each with their own height requirement. Moreover, their systems can easily leave large areas of PCBs unsupported, since when placed under a tall component, their gel-packs which are mechanically constrained, may not give enough, lifting the substrate higher than required.

Possibly more importantly, machines made today are increasingly difficult for operators to get into (reach into) with tooling. These machines are becoming larger, with fewer access points. Actual work areas within the machines are often out of reach, or require significant machine break-down to reach into.

It has therefore become necessary to develop flexible and universal support tooling that is integral with the various machines and adapts and adjusts to the machines systems as they accommodate a substrate's width and length.

In this regard, applicants have invented various techniques and inventions to integrate substrate support systems with the common elements found in these systems, specifically with the edge rails, be they conveyor rails, lifting rails, or clamping rails and commonly with the lifting tables. Applicants' invention can also be used with the rails found on many batch processes. In one of its simplest forms, it can simply be laid on a machine's work table.

It should also be noted that the table 24, itself, is not required and the system can be attached to the lifting mechanism to which the table would normally be attached.

In the instance where the means to lift support pins (mechanical, hydraulic, pneumatic, electric) are integral to the support system themselves, additional lifting mechanisms may or may not be required. The invention is merely typically attached to the front 22 and rear 23 conveyor rails (or the lifting table rails 12, 13 or the rails of a batch process—herein referred to overall as edge support rails or edge support rail system) at a specific height, and the substrate support system is then set upon the invention. Here, the pins start in the down position and after the substrate moves into position the pins then lift up to meet the substrate before they are "locked" into position.

Support Tooling that Adjusts with Substrate Size

Figure 11:
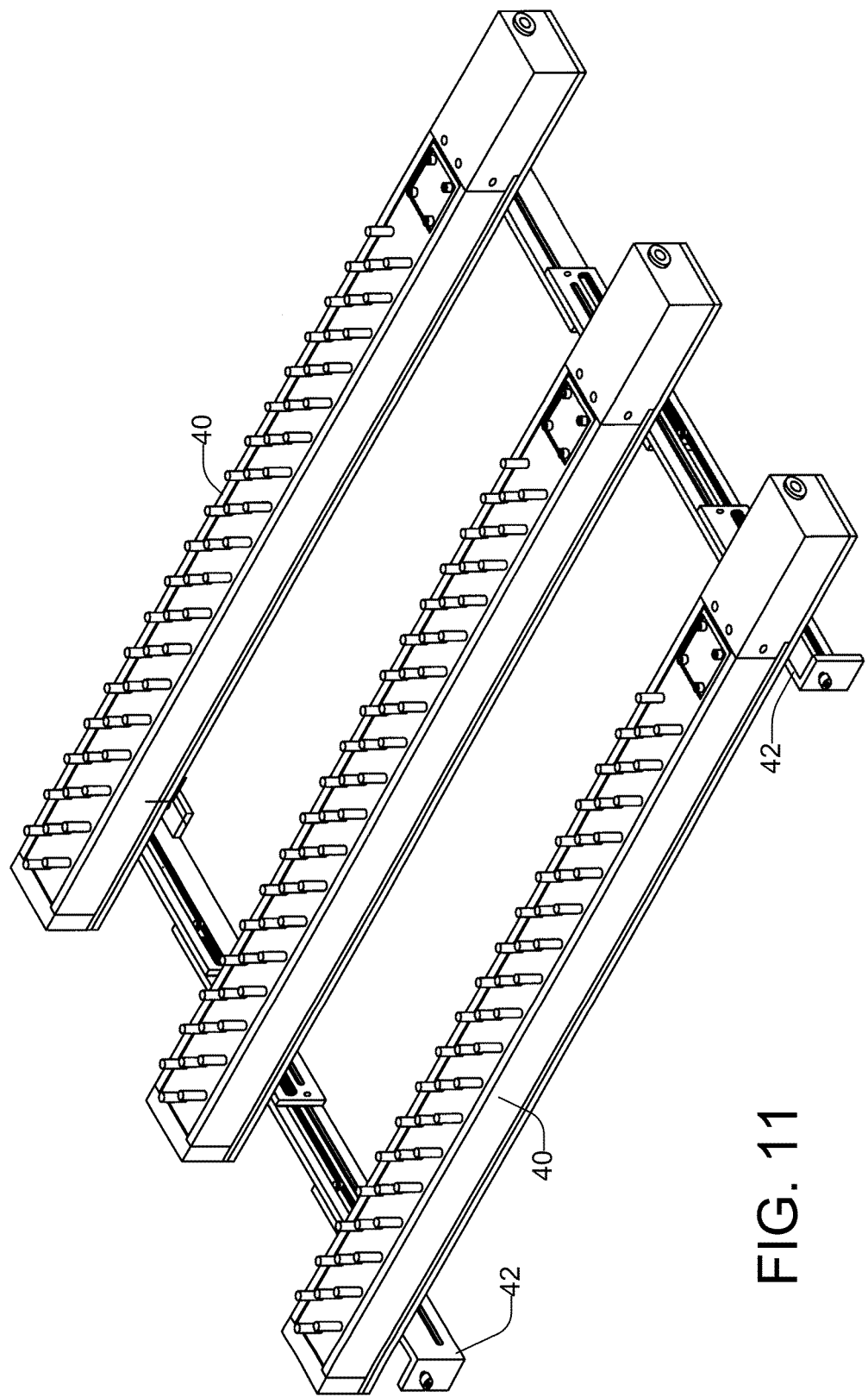
FIG. 11 is a diagram showing an isometric view of a first embodiment of the present invention.
Figure 12:
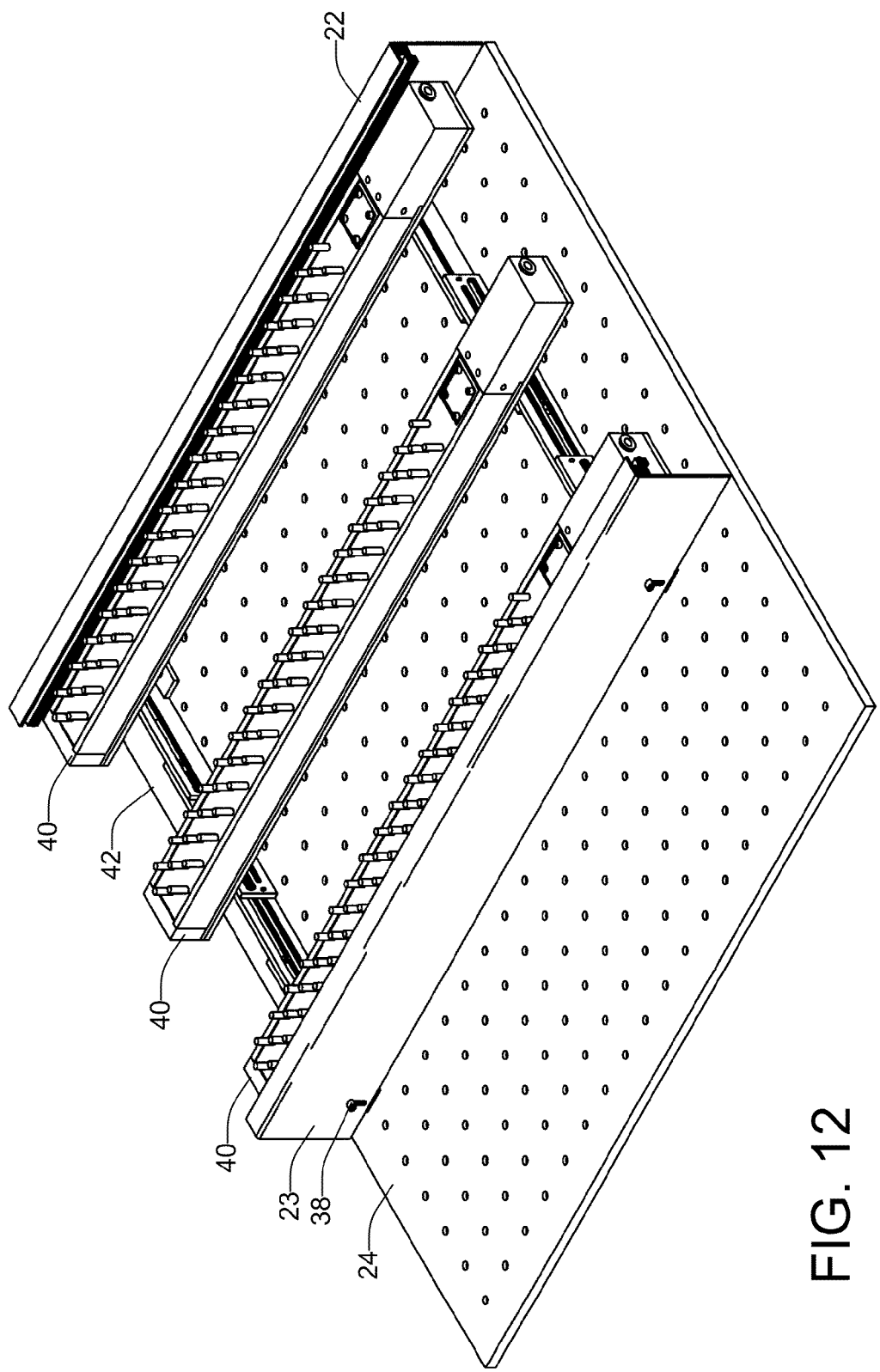
FIG. 12 is a diagram showing an isometric view of a first embodiment of the present invention a first embodiment.
Figure 13A:
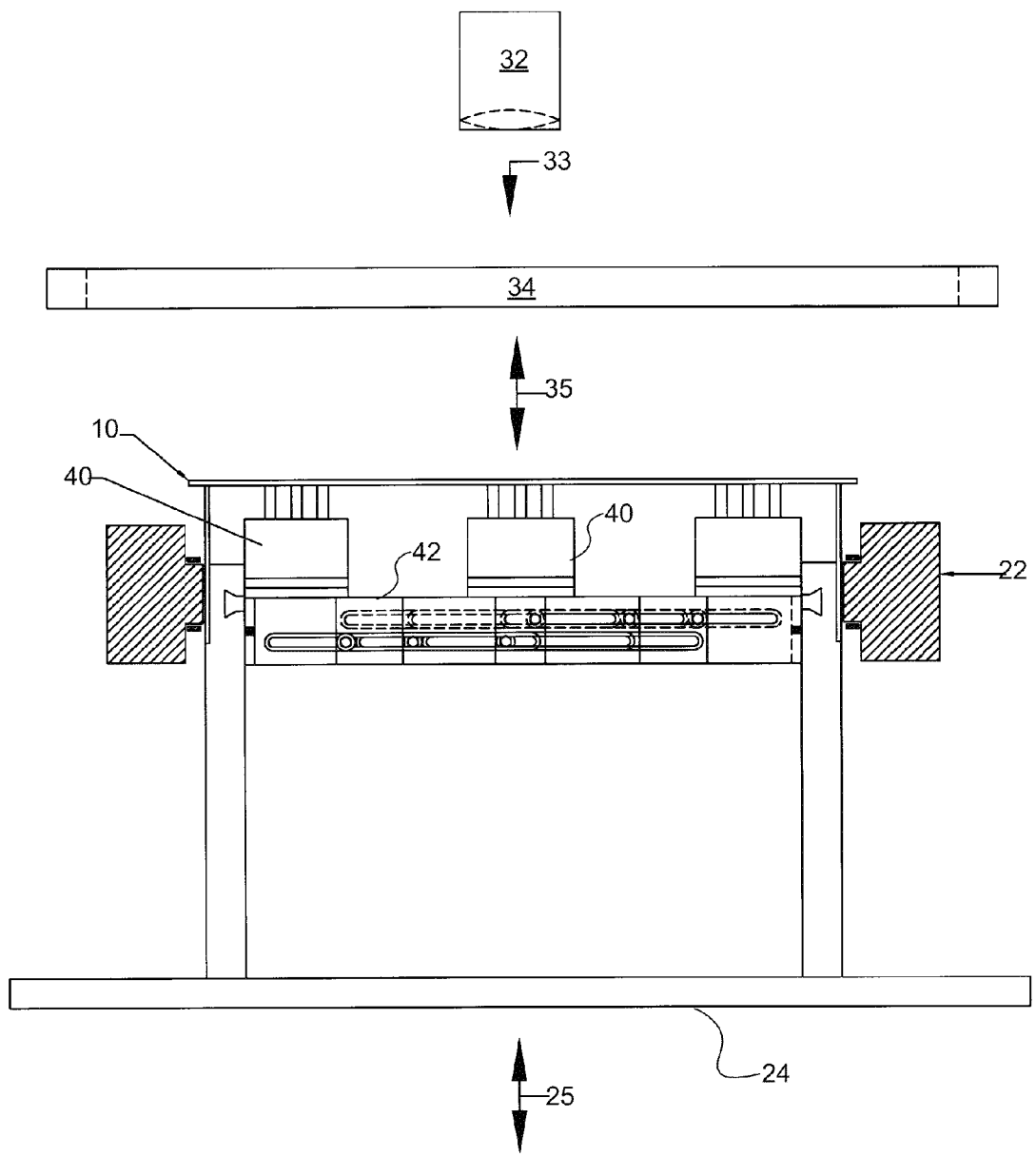
FIGS. 13a and 13b are diagrams showing side views of the embodiment shown in FIGS. 11 and 12 implemented with the exemplary integrated conveyor system shown in FIG. 1.
Figure 13B:
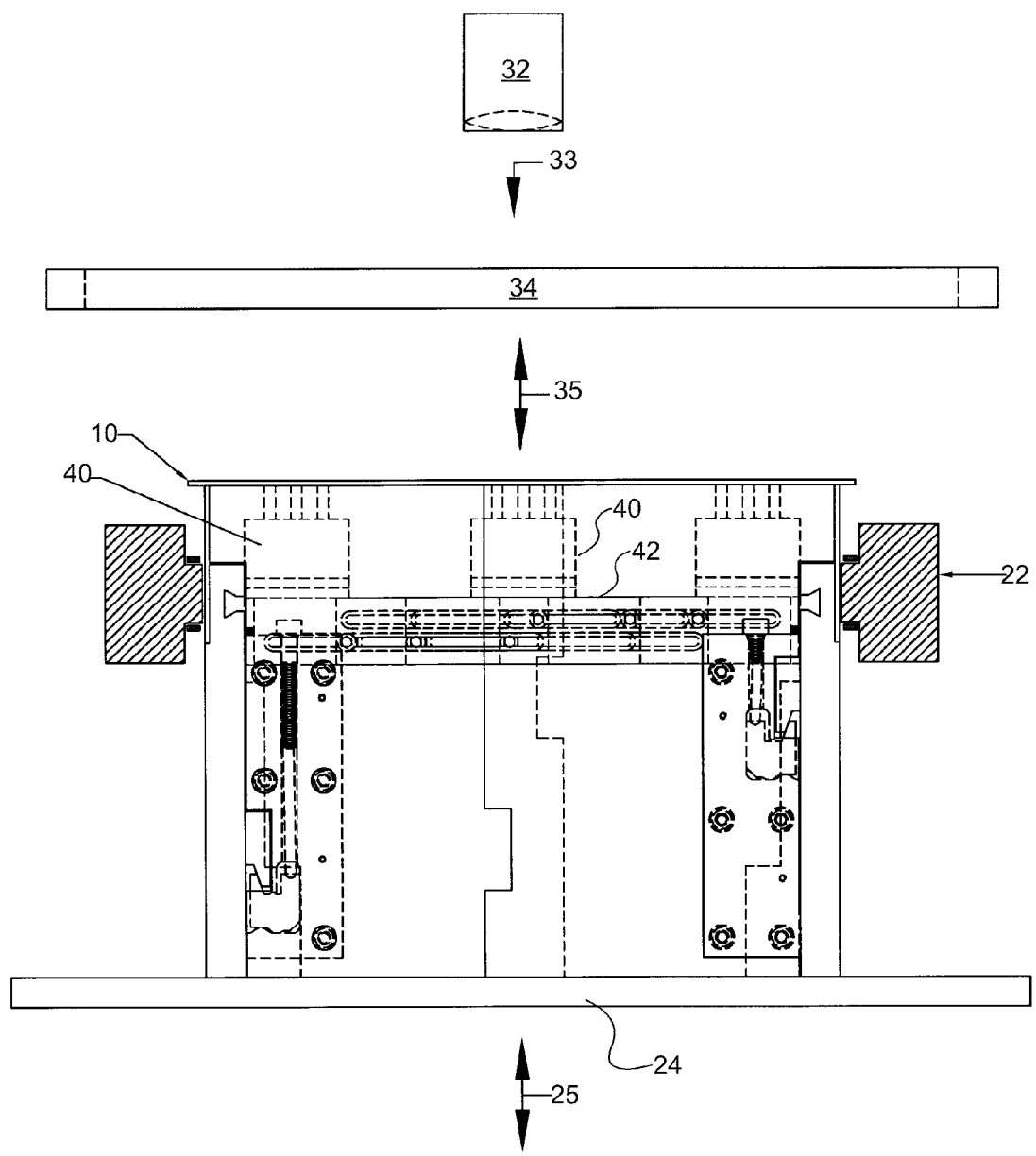
Figure 14:
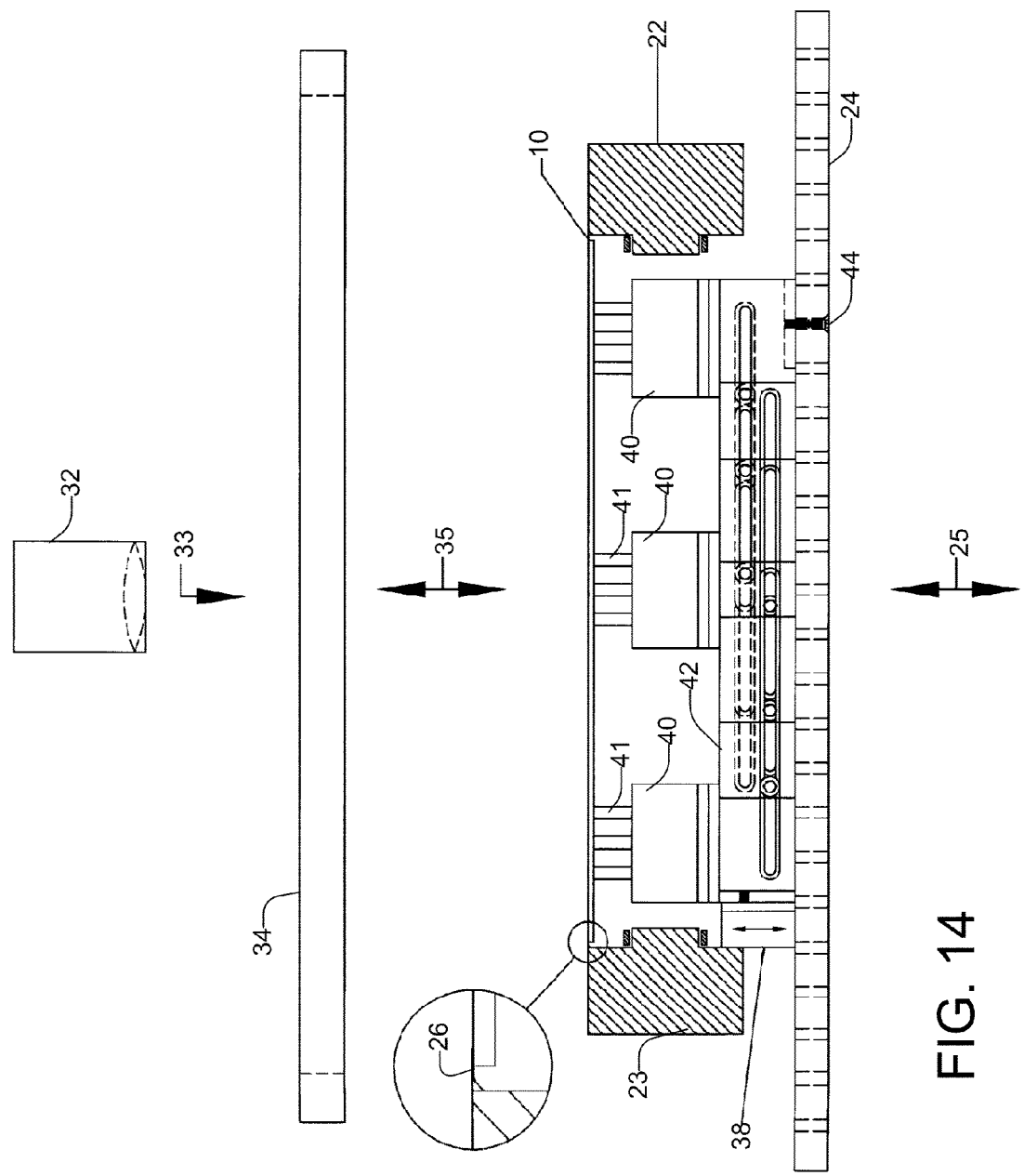
FIG. 14 is a diagram showing a side view of the embodiment shown in FIGS. 11 and 12 implemented with the exemplary integrated conveyor system shown in FIG. 2.
Figure 15:
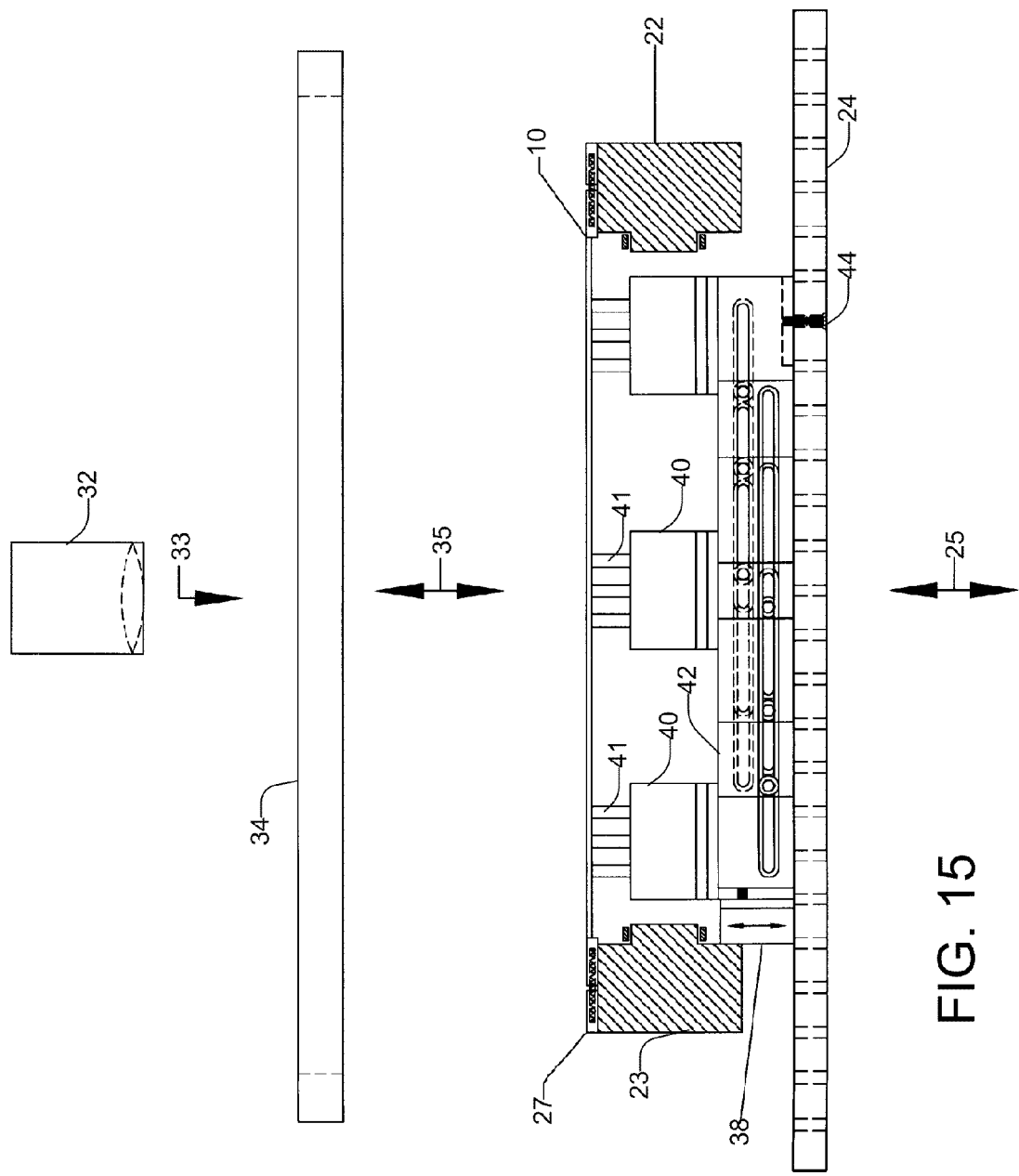
FIG. 15 is a diagram showing a side view of the embodiment shown in FIGS. 11 and 12 implemented with the exemplary integrated conveyor system shown in FIG. 3.
Figure 16:
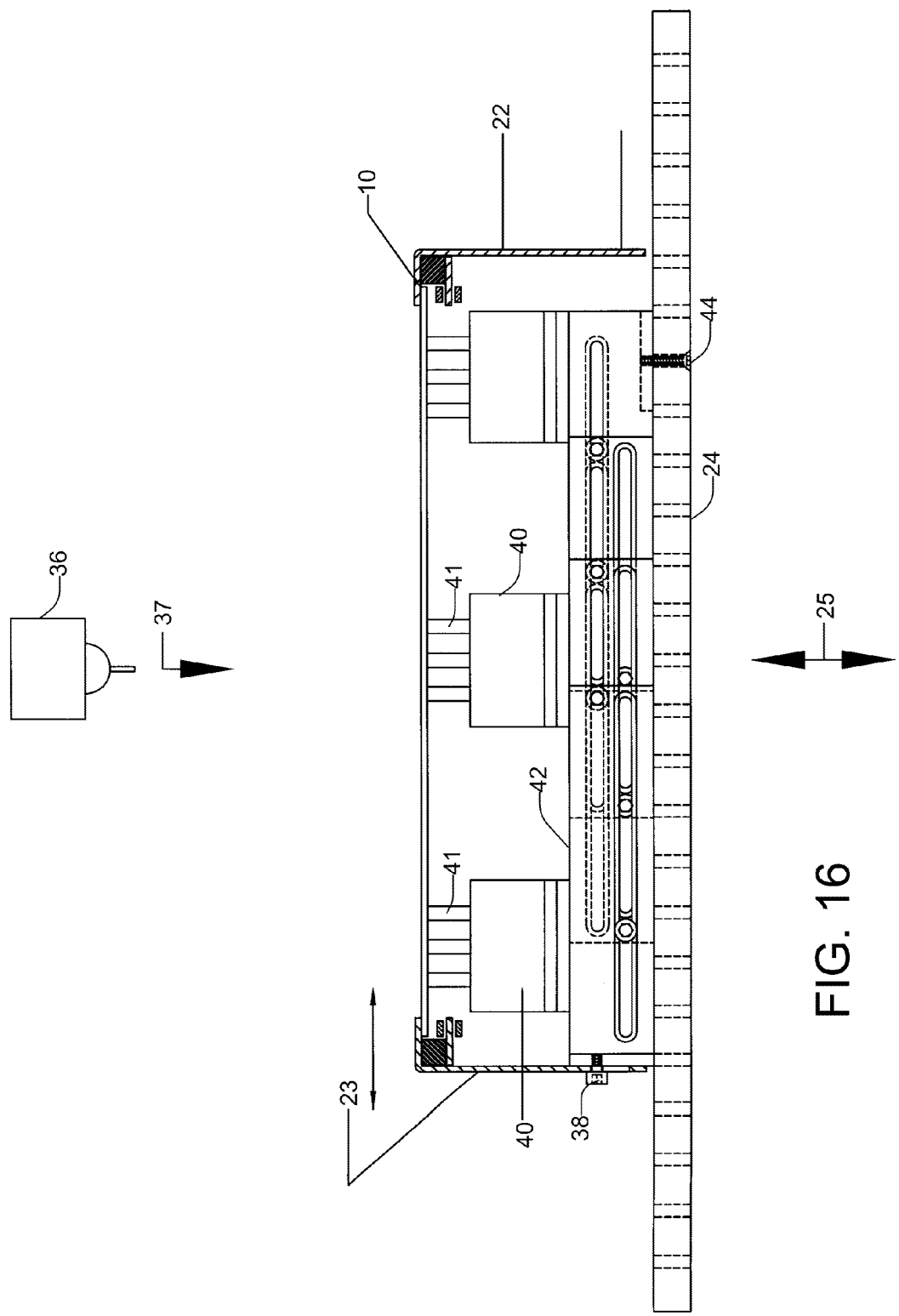
FIG. 16 is a diagram showing a side view of the embodiment shown in FIGS. 11 and 12 implemented with the exemplary integrated conveyor system shown in FIG. 4.
Figure 17:
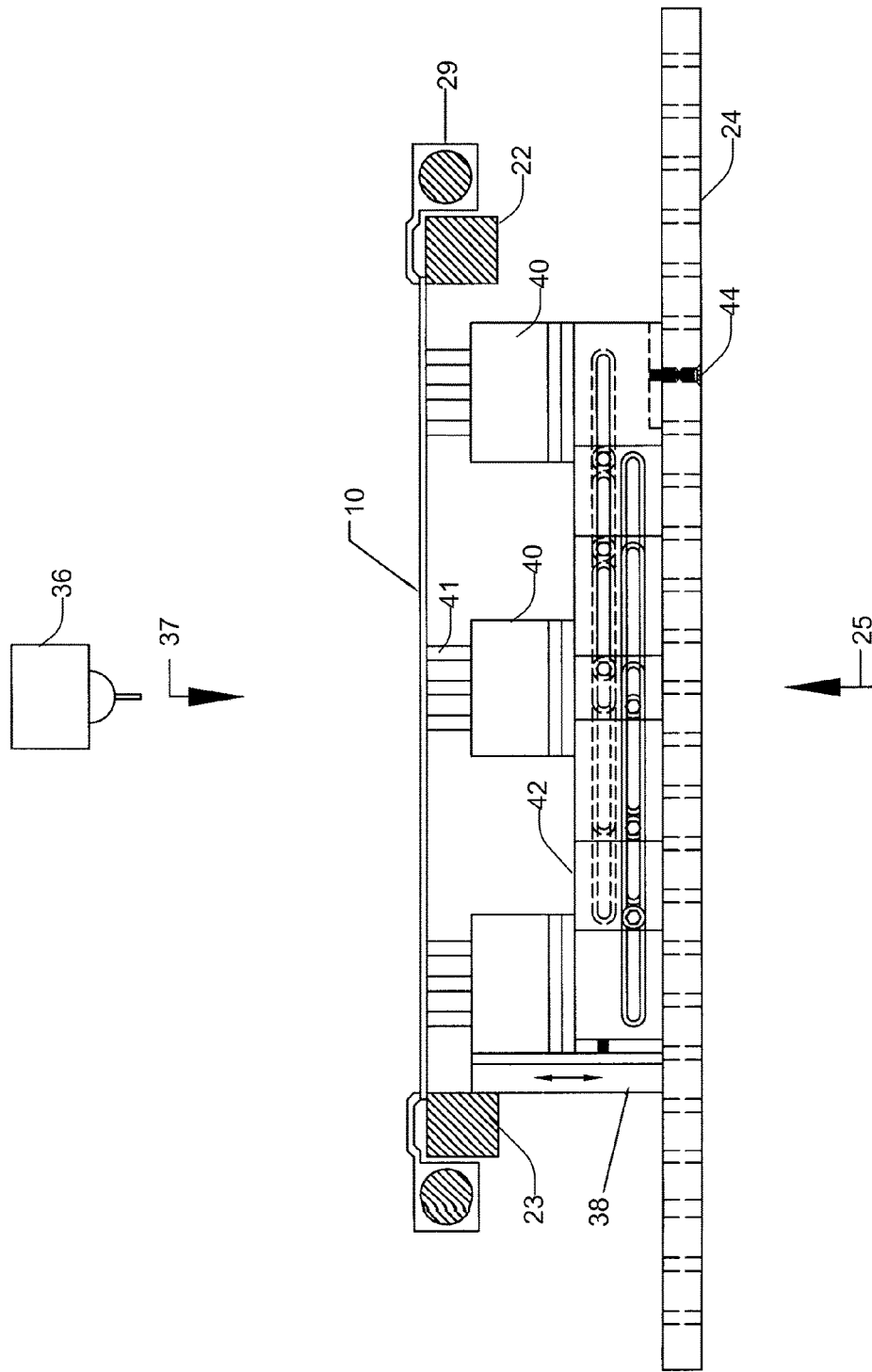
FIG. 17 is a diagram showing a side view of the embodiment shown in FIGS. 11 and 12 implemented with the exemplary integrated conveyor system shown in FIG. 5.

FIGS. 11 and 12 illustrate one embodiment of the present invention. FIG. 11 shows the embodiment without front and rear conveyor rails and table. FIG. 12 shows the embodiment with the front 22 and rear 23 conveyor rails and table 24. In this embodiment, two sets of length-wise adjustable (overlapping—side-by-side) rails 42 are attached to the rear conveyor rail 23 with up and down slide mechanisms 38 and to the table 24 near the front conveyor rail 22 at a fixed distance apart. The substrate support system straddles the two sets of adjustable rails, and as the table 24 lifts 25, the support system 21 lifts by means of the table 24 and the up and down slide mechanisms 38.

Where attached to the conveyor rails 22, 23, the apparatus comprises an up and down slide mechanism 38 so that when the table 24 lifts up, the two sets of adjustable rails 42 lift up with the table 24. According to aspects of this embodiment, the rails 42 rest upon the table 24 with the top edge of the adjustable rails 42 set at a predetermined height. The support strips 40 then sit on top of the adjustable rails 42 with the total height approximately equal to the machine's support tooling height requirement. It should be noted that there may be some over-travel of the pins 41 (approximately 0.010"-approximately 0.070") to ensure full engagement of the substrate 10 with the pins 41. The support strips 40 can be held in place to the rails by magnets, pins, or any other device. As the conveyor moves back and forth to accommodate various PCB substrate widths, the adjustable rails 42 lengthen or shorten (widen or narrow) as required and Red-E-Set support strips 40 can be added or removed. In another embodiment of the present invention, the front conveyor rail 22 is fixed and the adjustable rails 42 can be directly attached 44 to the table 24 at the fixed conveyor rail ends 22, with only two up and down slide mechanisms 38 required at the ends of the two sets of adjustable rails 42 where they attach to the moveable conveyor rail 23. In yet another embodiment, both conveyor rails are adjustable 22, 23, and four slide mechanisms 38 may be present and the rails 42 are not attached to the table 24.

FIGS. 13-17 show side views of the embodiment shown in FIGS. 11 and 12 integrated with the various types of conveyor systems described above in FIGS. 1-5. FIGS. 13a and 13b show the embodiment shown in FIGS. 11 and 12 integrated with MPM's vacuum box printing system, with and without the side plates attached.

Support strips 40 closest to the conveyor rails 22, 23 can be pinned in place so that when the conveyor rail gap widens or shrinks, these two support strips 40 will only move in relation to each other, but remain close to the conveyor rails 22, 23. Support strips 40 in between the support strips 40 closest to the conveyor rails 22, 23 in this embodiment may or may not remain equidistant from each other without additional mechanical means. They are therefore left "floating" in position, and may have to be adjusted after the conveyor rails 22, 23 are brought to their proper width requirements.

Another embodiment may minimize the length of the adjustable rails 42, a series of short rails may be used that when collapsed could be one desired length, and expand to the maximum distance that the conveyor rails 22, 23 can spread apart. Magnets would typically be attached to the bottoms of the support strips 40 and the adjustable rails 42 may be made from a magnetic material such as steel or, conversely, magnets may be embedded into the adjustable rails and the underside of the support strips 40 may have magnetic material attached (such as thin steel strips adhered by glue or double-sided tape), or the base of the support strips 40 may be made from steel which would either be zinc plated or made from a martensitic stainless steel.

Many different types of linear motion slide mechanisms can accomplish this task of the sliding rails 42. Shafts and support shafts or rails, linear bearings with mounts, precision guide blocks and rails, track roller guide blocks and rails, threaded rods and ball screws, etc.

Figure 29:
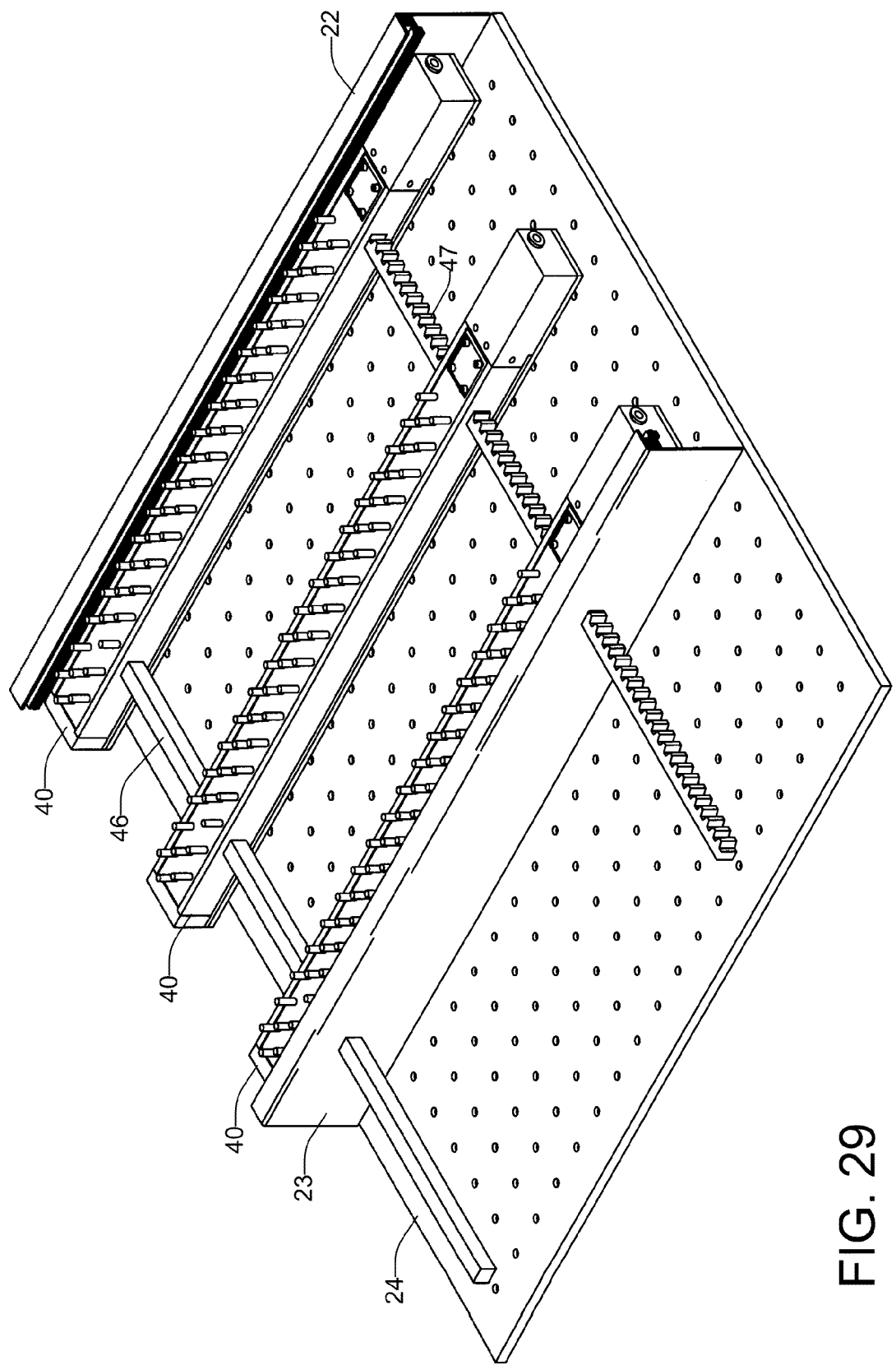
FIG. 29 is a diagram showing a perspective view of a fourth embodiment of the present invention.
Figure 30:
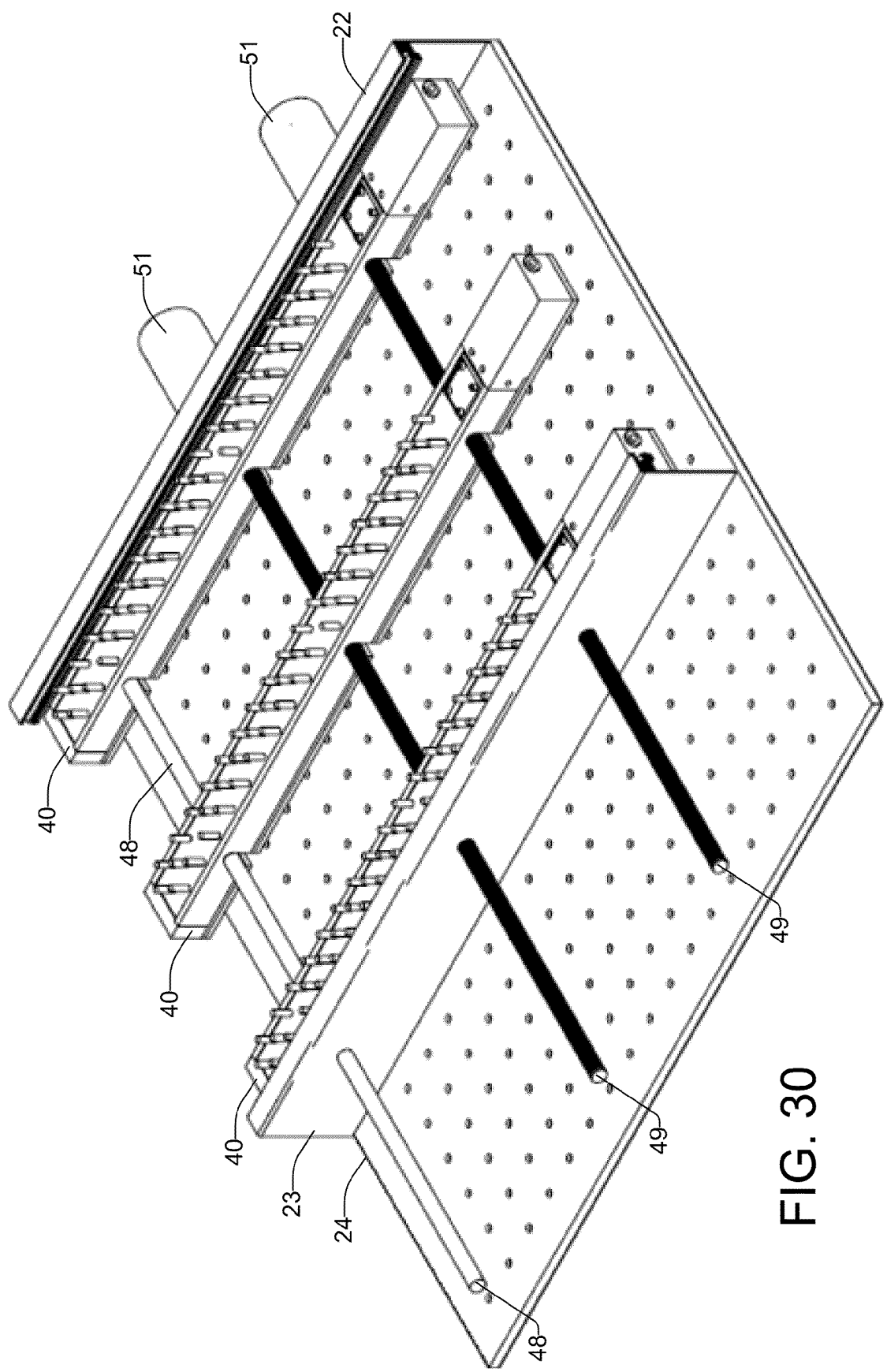
FIG. 30 is a diagram showing a perspective view of the fourth embodiment of the present invention.

FIGS. 29 and 30 show another embodiment of the present invention. The two rails 46, 47 (FIG. 29), 48, 49 (FIG. 30) are attached to the front conveyor rail 22 and extend through the moveable conveyor rail 23. Here, they may not be attached to the table 24 at all. The rails 46, 47 can extend through the substrate support system 40, or the support system 40 can merely sit on top of the rails 46, 47. One rail 47, as shown, may be a rack (geared) and a motor with a proper spur gear can then move the support system or strips 40 back and forth along the rails 46, 47 as required. In this embodiment, it may be preferable for the support pins 41 to start in the down position, with means to move them upward as the PCB substrate 10 comes into position.

In fact, rails can be attached to the table with support strips 40 attached to linear bearings with mounts. In this case, the system does not have to attach to the lifting rails or conveyor rails (although cutouts in them would be necessary to accommodate the rails), and the support strips 40 can be moved back and forth along the rails 46, 47, 48, 49, by mechanical (including hydraulic or pneumatic) means or electro-mechanical means. Any number of other means may also be used to move the support strips and are within the scope of the present invention.

In FIG. 29, the two rails 46, 47 are typically attached to the front conveyor rail 22, and extend through the moveable conveyor rail 23. In this case, the rails 46, 47 may not be attached to the table 24 at all, and in fact, the table 24 may be effectively superfluous. These rails 46, 47 can extend through the substrate support system 40, the support system 40 can sit on top of the rails 46, 47, or it can sit on the rails as shown in FIG. 30. One rail 47, as shown, could be a rack (geared), and a motor with a mating spur gear (on each support strip 40 (not shown)) could then move the support system or support strips 40 back and forth along the rails 46, 47 as required. In this configuration, support pins 41 would typically need to start in the "down" position, with means to move them upward as a PCB substrate 10 comes into position.

In FIG. 30, two or more rails 48, 49 may be used, with one or more of the rails being screw-drives 49. The screws 49 would typically be turned by a motor 51 attached to one of the conveyor rails 22, 23. In this case, each support strip 40 would typically require its own screw 49, with the possible exception being the unit closest to the fixed rail 22. The support strips 40 could have the rails going through them as shown in FIG. 29, they may sit on the rails, or they may have the configuration as shown in FIG. 30. Each unit would typically have a threaded insert (not shown) that the screws 49 would then engage, moving the support strips 40 back and forth, as required. As shown in this case, the threaded insert could be half moon-shaped to facilitate the ability to drop on (add) or remove additional support strips 40 as needed.

These rails 48, 49 could also be support shafts (rails) with linear bearings with mounts. The system could be made to move the support system 40 back and forth by electro-mechanical means, with optical sensors and the like for positioning. All of this could also be integrated with the system's computer system. The rails 46-49 may also be attached to the table 24 with vertical slots cut in the moveable conveyor rail 23 that would allow the system to still move up and down. Here, support pins 41 may not need to start off in the down position.

The rack (geared rail) 47, 49 could also be constructed like the other rail 46, 48, whereby the support system could be moved about manually and held in place with magnets and the like. There are numerous variations on this theme that those who are skilled in the art could change and still achieve the same effect.

In another embodiment, the rails could also be support shafts (rails) with linear bearings with mounts. The system could be made to move the support system back and forth by electro-mechanical means with optical sensors, or any other means, for positioning. The system may also be integrated with the machine's computer system. One could also attach the rails to the table with vertical slots cut in the moveable conveyor rail 38 that would allow the system to still move up and down. Here, the support pins would not need to start off in the down position.

The rack (geared rail) 47, 49 could also be made like the other rail 46, 48 whereby the support system could be moved about manually and held in place with magnets and the like.

Figure 18:
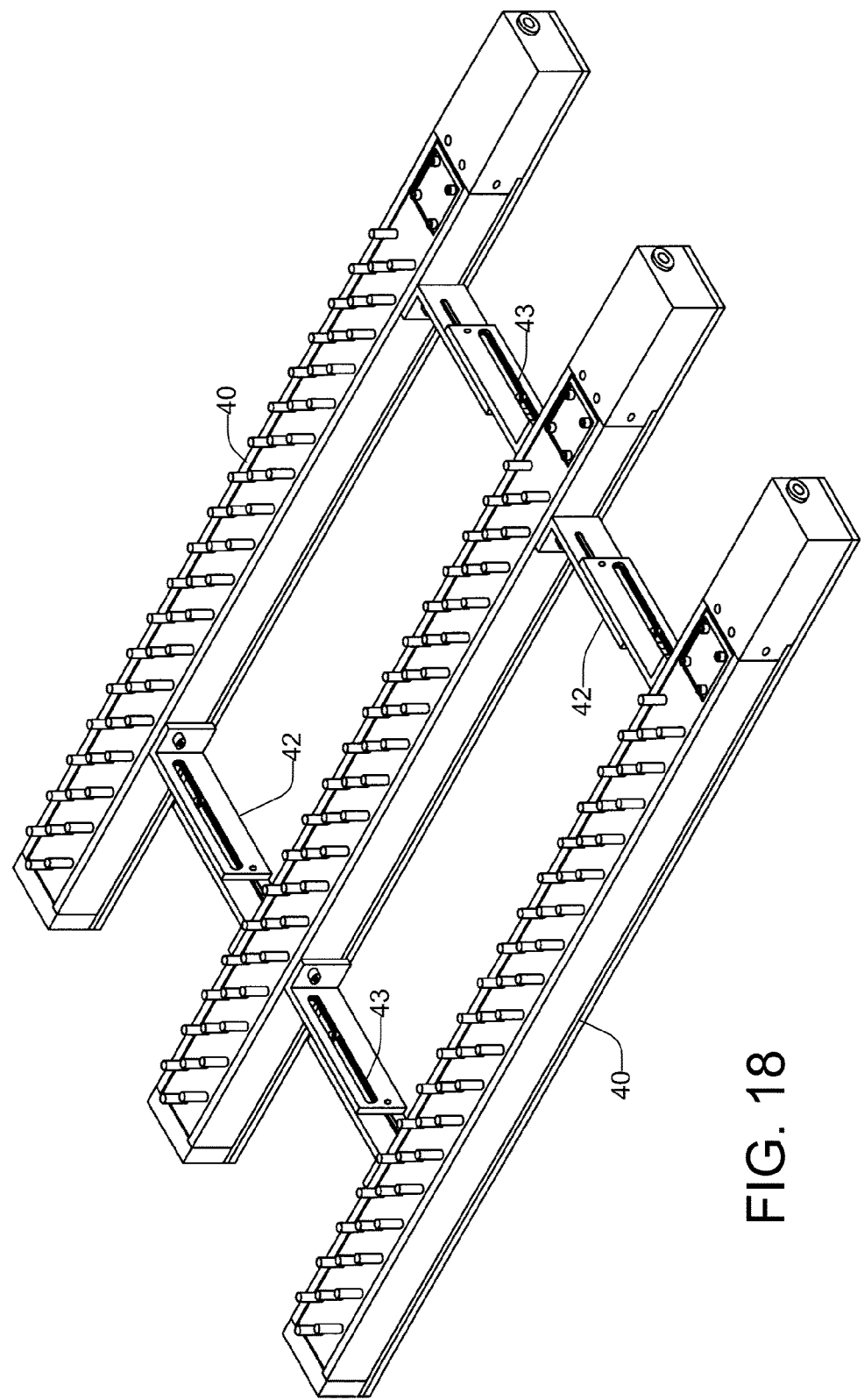
FIG. 18 is a diagram showing an isometric view of a second embodiment of the present invention.

In another embodiment of the present inventions, the support strips 40 do not need to sit on the adjustable rails. They may sit directly on the table 24 and have the adjustable rails attached to the sides of the support strips 40 or at the ends of the support strips 40 (FIG. 18). In this case, each support strip 40 would preferably have a set of adjustable rails between each support strip 40, with only the support strips 40 closest to the front 22 and rear 23 conveyor rails attached to any up-and-down linear motion slide mechanisms 38. Again, if the front conveyor rail 22 is fixed, the support strip 40 closest to the front conveyor rail 22 can be attached 44 directly to the table 24.

It can also be seen that under the support strips 40, an appropriate means may be employed to raise the support strips 40 to a proper height if necessary. This can be achieved by some standoff means. This allows support strips 40 to be of standard "modular" heights.

Figure 19:
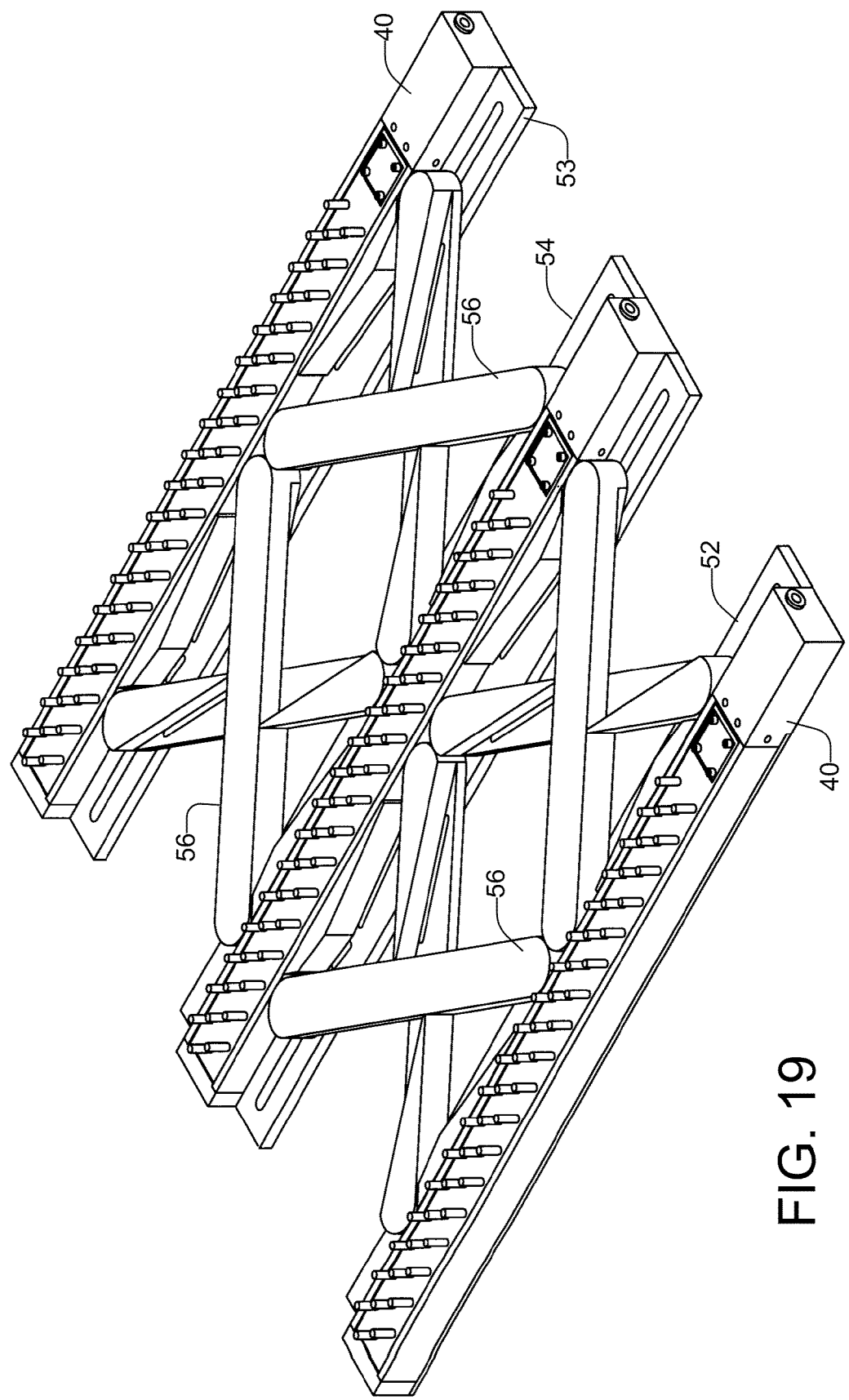
FIG. 19 is a diagram showing an isometric view of a scissors pallet in a third embodiment of the present invention.

In yet another embodiment of the present invention, a scissor pallet can also be used in this manner. According to aspects of this embodiment, between each support strip 40 can be a scissor-like system attached to each support strip 40 on its sides as required (FIG. 19).

Figure 20:
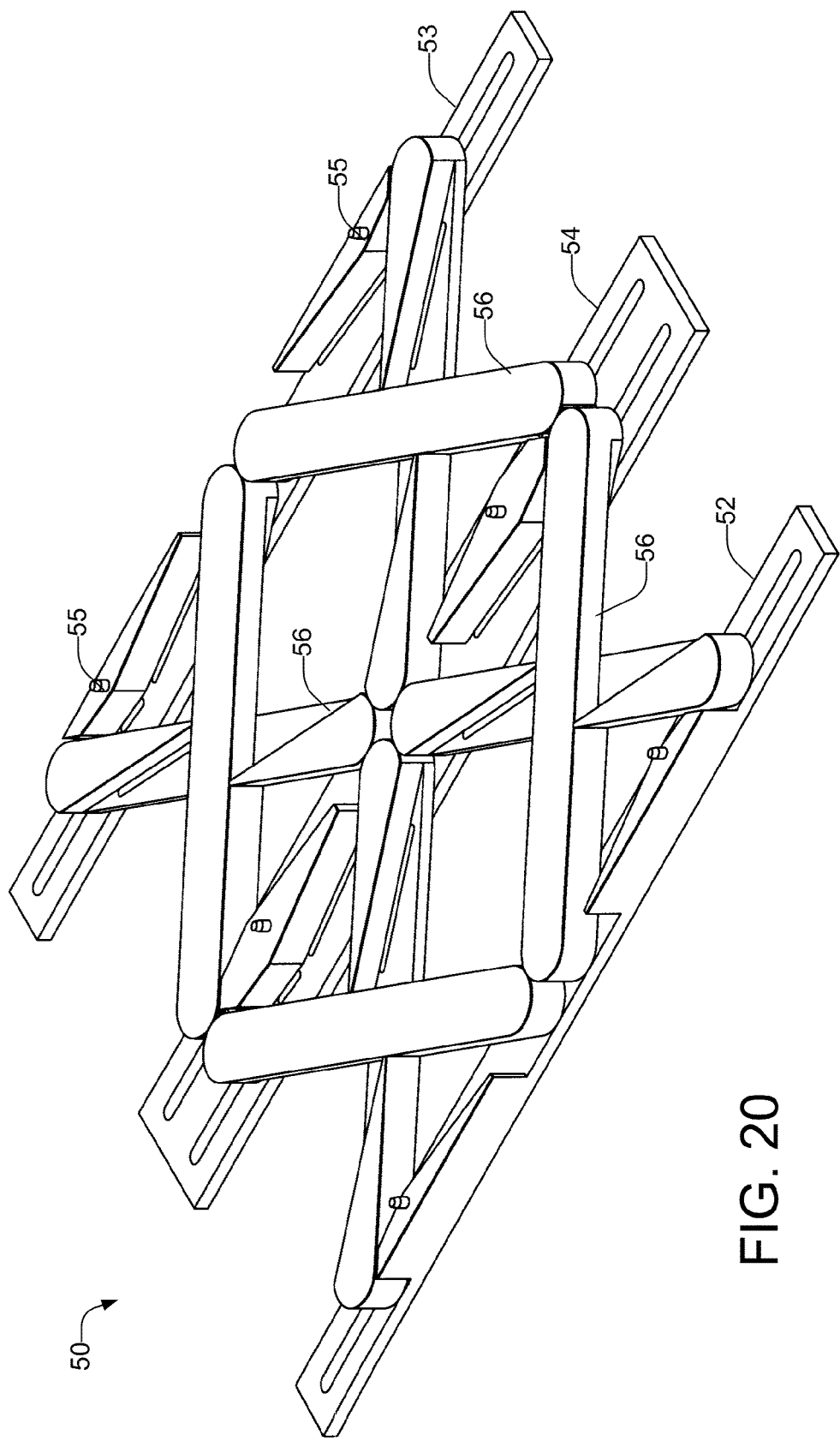
FIG. 20 is a diagram showing an isometric view of the scissors pallet in the third embodiment of the present invention.
Figure 21A:
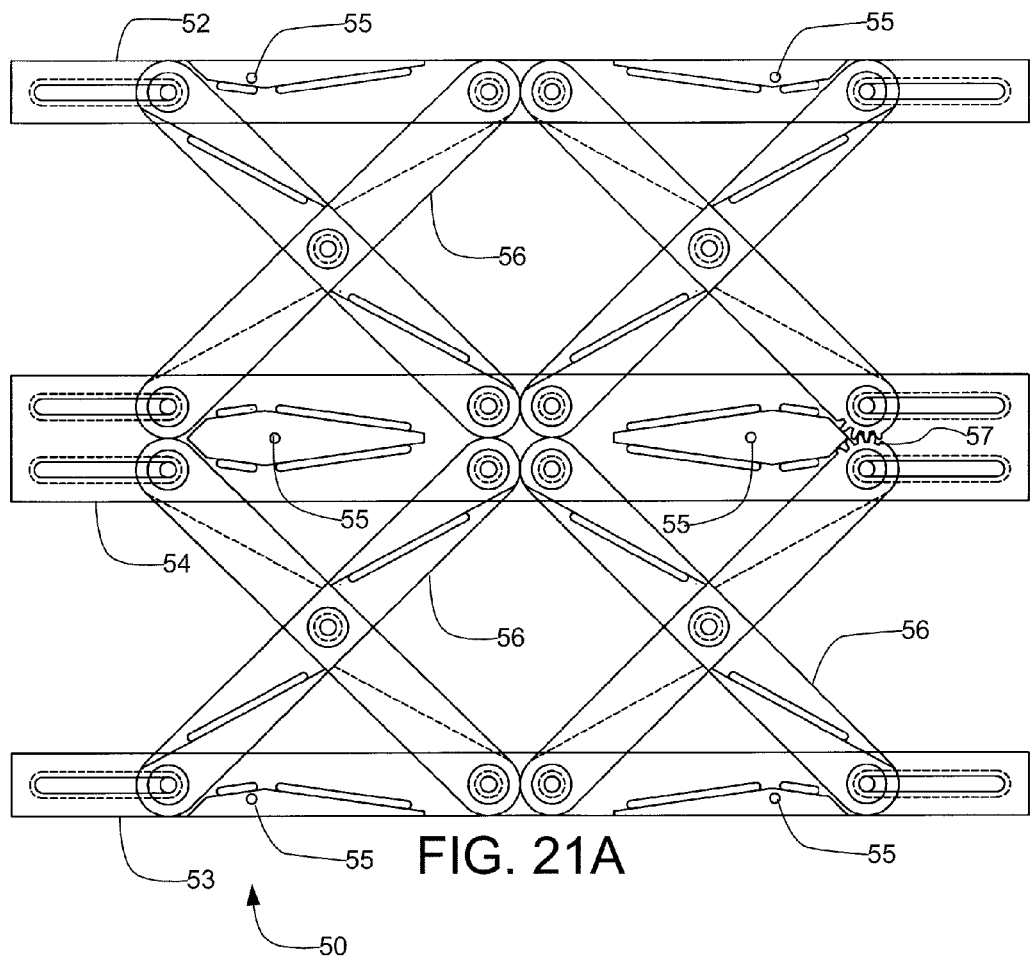
FIGS. 21A and 21B are diagrams showing top plane views of the scissors pallet shown in FIGS. 19 and 20.
Figure 21B:
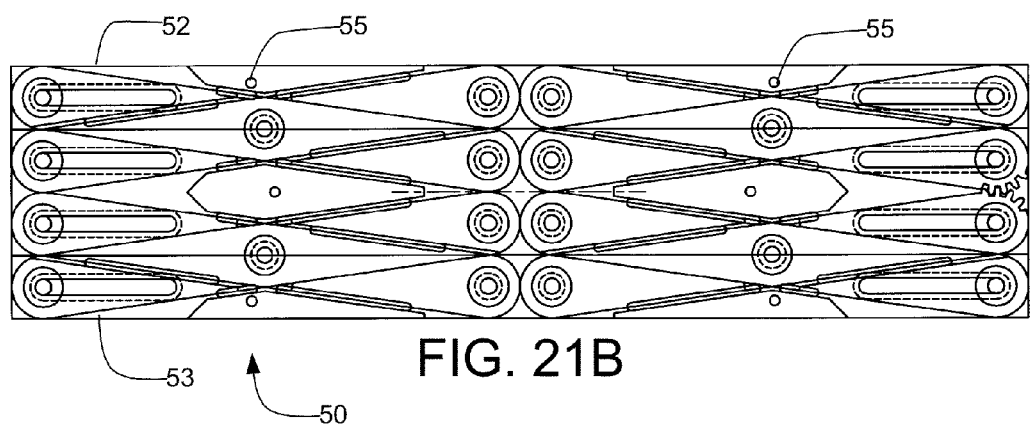

FIGS. 20 and 21 show another embodiment of the present invention. In this embodiment, a scissors pallet 50 holds the support strips 40, and acts much like a sideways placed scissor jack. The front lateral rail 52 of the scissors pallet 50 may be attached 44 to the table 24 in the case where the front conveyor rail 22 is fixed, and the rear lateral rail 53 of the scissors pallet 50 may be attached to the adjustable conveyor rail 23 by means of at least one up and down linear motion slide mechanism(s) 38. If the front conveyor rail 22 is moveable, too, then the front lateral rail 52 of the scissors pallet 50 may also be attached to the front conveyor rail 52 by means of a slide(s).

Figure 22:
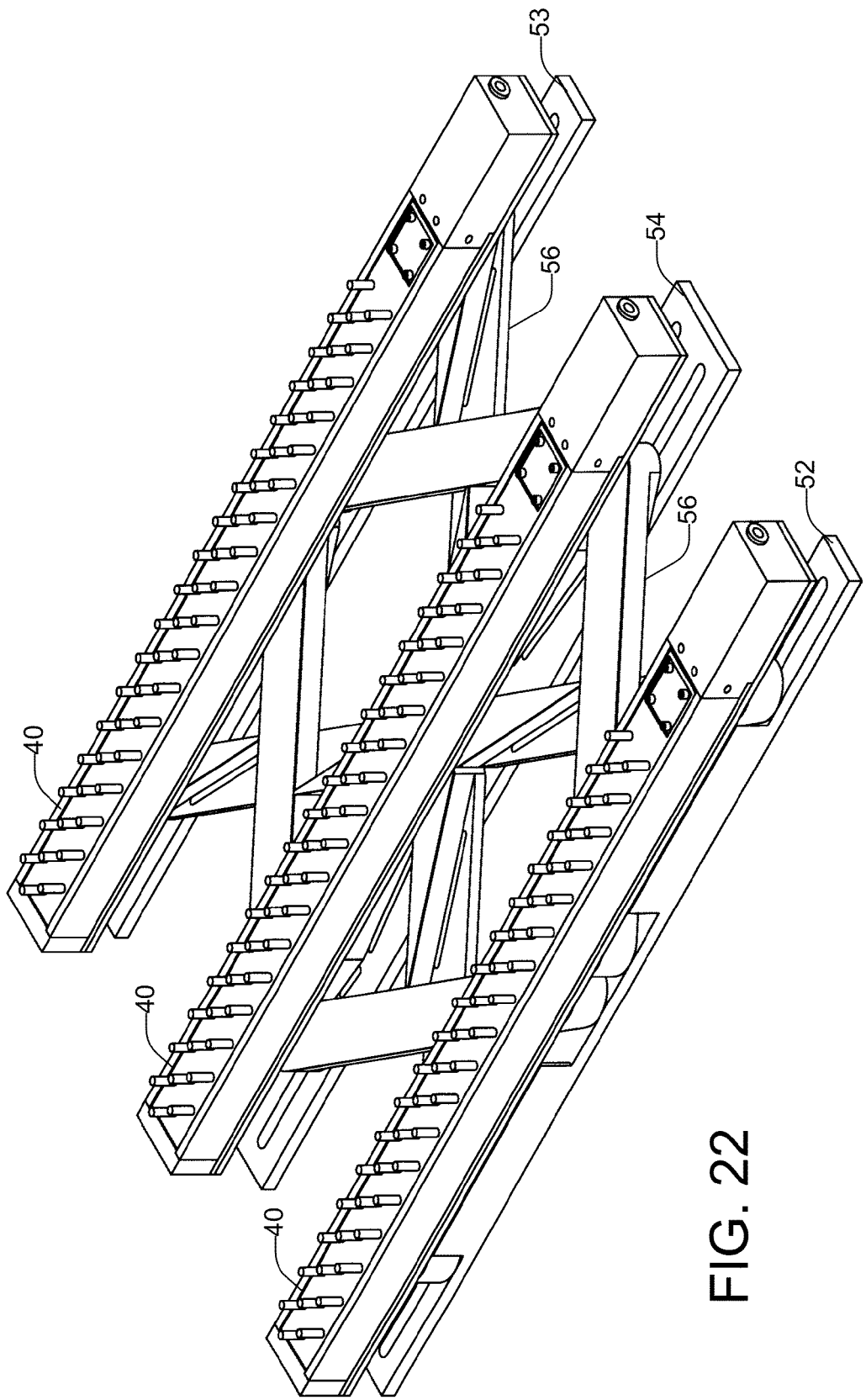
FIG. 22 is a diagram showing an isometric view of the scissors pallet shown in FIGS. 19 and 20 with support tooling installed.
Figure 23:
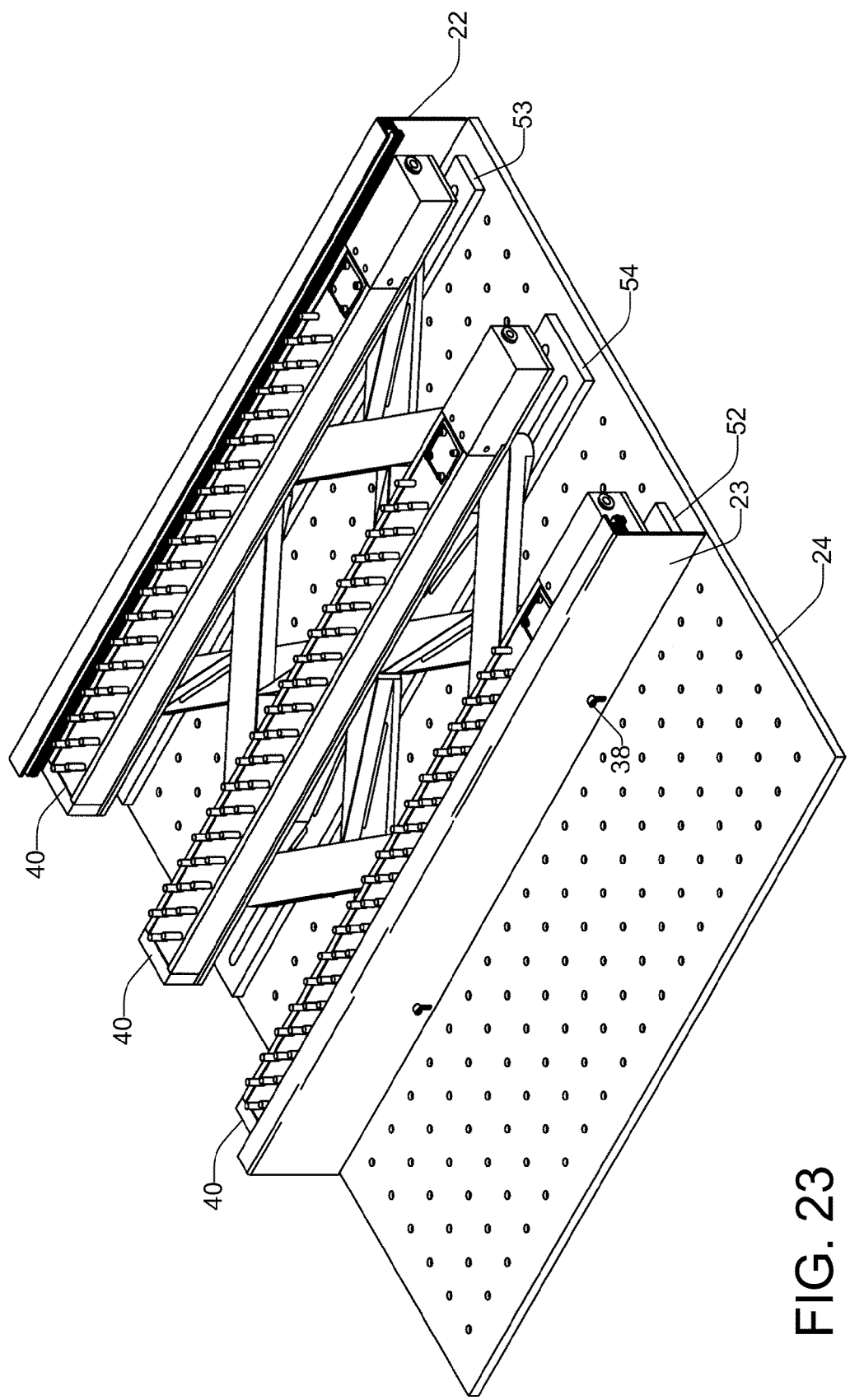
FIG. 23 is a diagram showing an isometric view of the scissors pallet shown in FIGS. 19 and 20 with support tooling installed on a table.
Figure 24A:
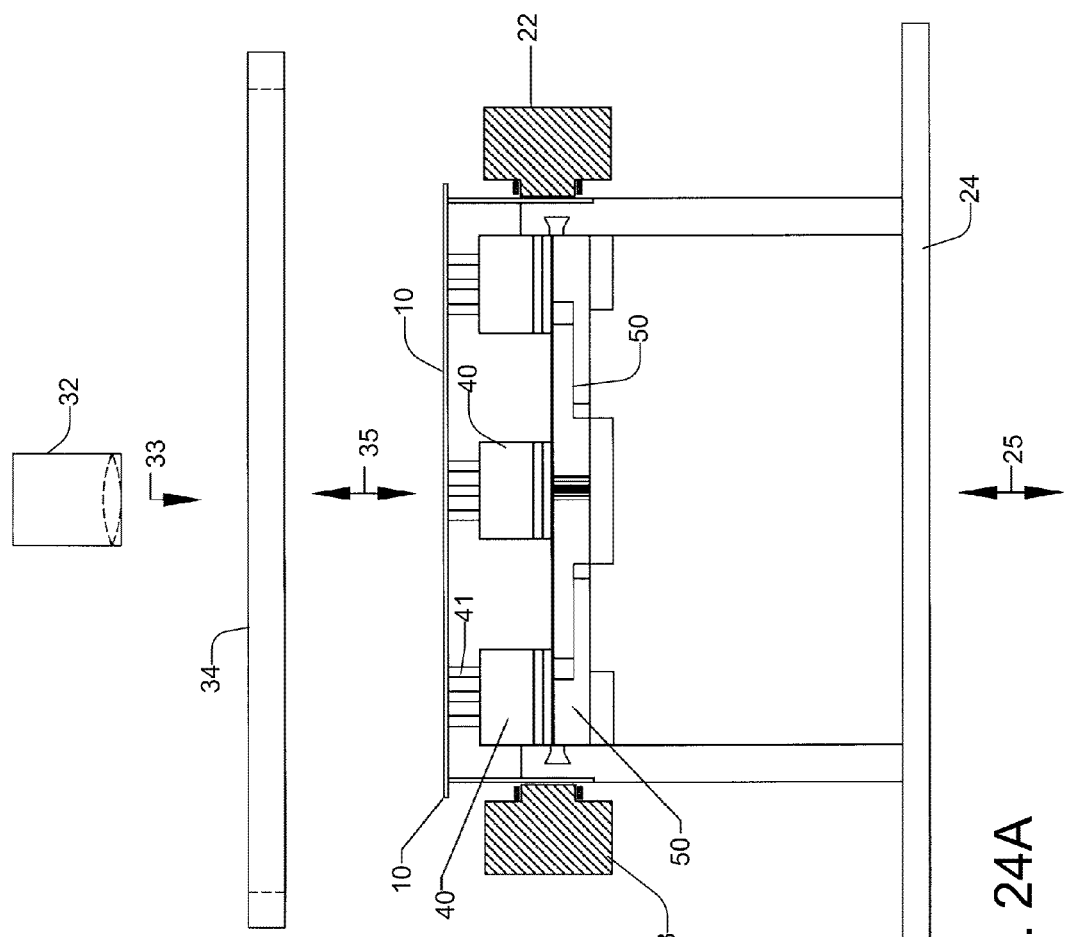
FIGS. 24A and 24B are diagrams showing side views of the embodiment shown in FIGS. 19 and 20 implemented with the exemplary integrated conveyor system shown in FIG. 1.
Figure 24B:
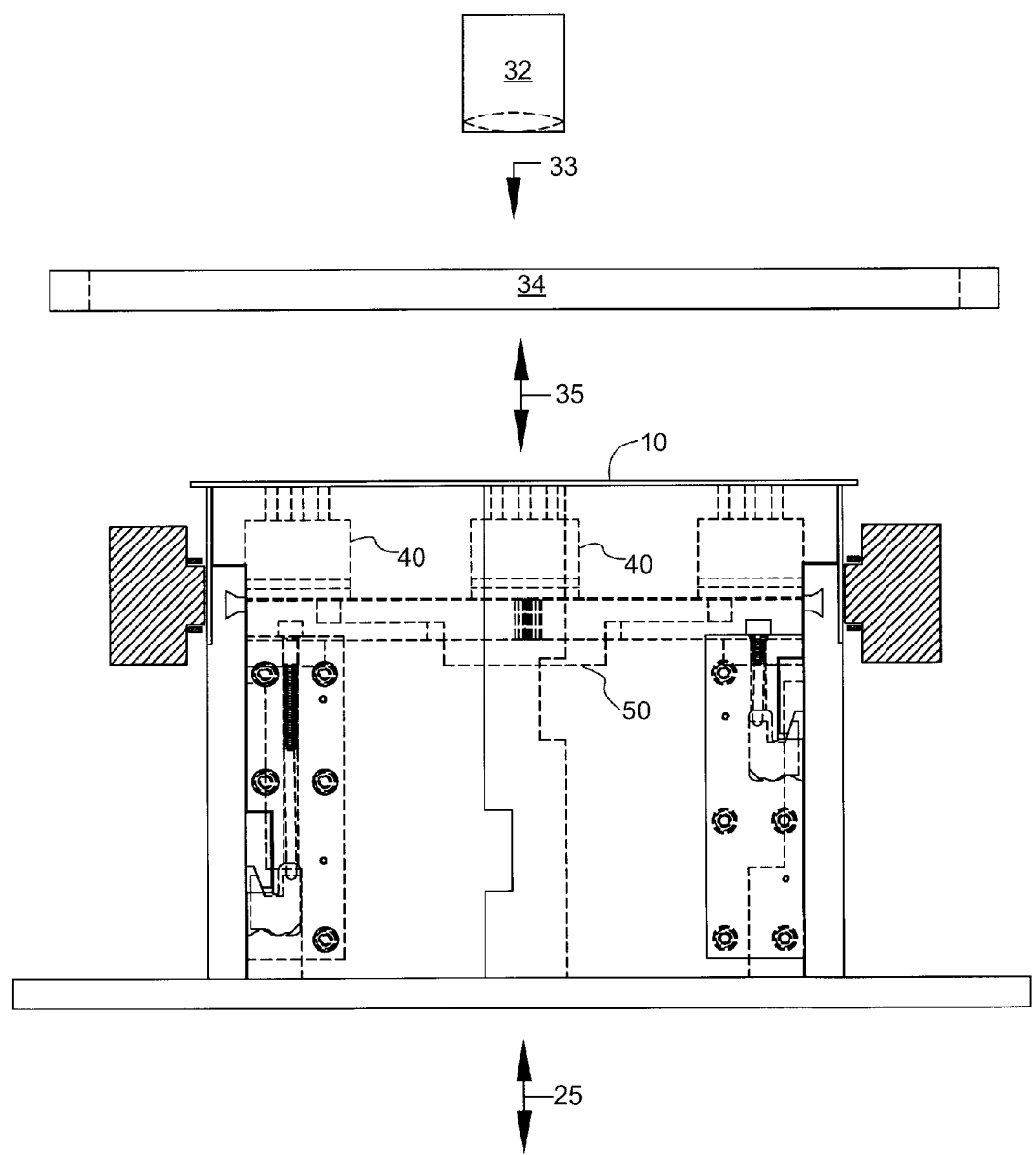

The scissors pallet 50 typically sits on the table 24. Its height is preferably sized to the minimum machine requirement for all of the machines that might possibly use this system, so that when support strips 40 sit on top of the scissors pallet 50 (FIGS. 22 & 23), their total height is approximately equal to the machine's tooling support height requirement. For machines with greater height requirements, standoff supports may be placed under the scissor pallet's 50 lateral rails 52, 53, 54 or under the individual support strips 40.

In one embodiment of the invention, the system accommodates a minimum of three (3) Red-E-Set support strips 40 which totals a minimum width of approximately 3.96" (1.32"×3). It should be noted that there could be as few as one support strip 40 and a maximum of whatever the widest machine could accommodate. The system is easily scaleable. In accordance with aspects of this embodiment, the support strips 40 may be held in place by ball-plunger style pins 55 and/or magnets. The magnets may be used as a final standoff, as the pins 55 preferably hold them in exact place. Without the pins 55, the support strips 40 could move around when the scissor pallet 50 is opened or closed even with the magnets. These three support strips 40 always stay in place relative to each other. The two outer support strips 40 that are closest to the conveyor rails 22, 23 are preferably located over the pallet's 50 front 52 and rear 53 lateral rails and will stay closest to the conveyor rails 22, 23 as the scissors pallet 50 is opened and closed. The middle support strip 40 is typically located over a center lateral rail 54 and will stay in the middle, equidistant from the outer support strips 40, as the scissors pallet 50 is opened and closed. This may be accomplished by a simple gearing system 57 machined on at least two of the cross beam members 56. While this is convenient, it is not mandatory. "Islands" on the lateral rails are preferably part of the design where the ball-plunger style pins 55 are embedded. As the system is opened, room is made to optionally accommodate additional support strips 40. The tops of the scissor pallet's 50 flat features preferably may have zinc plated steel sheets attached at appropriate areas, typically with glue, double-sided tape or screws. Additional support strips 40 may then be laid on top of the scissors pallet 50 as room for them is allowed upon opening the scissors pallet 50 and removed as the scissors pallet 50 is made to collapse. The additional support strips 40 may have a magnetic strip under them that hold them to the zinc plated steel plates attached to the scissors pallet 50. This arrangement may be swapped off if desired. If desired, a middle support strip 40 may be moved off of its pins 55 and placed to the side of the pins 55 if only a single additional support strip 40 can be added to the scissors pallet 50. This is typically the case when even number of support strips 50 are employed versus an odd number of support strips.

Many machines have weight requirements, that is, the table 24 cannot have too much weight applied. This is especially true for chip-shooter style pick-and-place machines, since the table is usually moving at a high rate of speed. The scissors pallet 50 must typically therefore be made of a light, yet stiff, material. Aluminum is typically too heavy, so a lighter material is preferably used. In this case, Delrin, about half the weight of aluminum may be preferable. An UHMW polyethylene may also be used. It is also typically important that the material be at least static-dissipative so that static electricity does not build up on the system and shock PCB substrates 10 that have components installed on them. Carbon impregnated polyethylene that is conductive may also be used. A spray on conductive coating may also be employed if necessary.

The scissors pallet 50 is preferably designed in two double X patterns using cross beams 56. Each double set of crossbeams attaches to a front lateral rail 52 and also a rear lateral rail 53 and then they both attach to the center lateral rail 54. This maximizes surface area for the zinc plates to attach to allowing for the magnetized support strips 40 that are not held in place by pins 55 to stay put. In one embodiment, the scissor pallet has a 1:0.75 expansion, that is, it almost expands as wide as it is long. In another embodiment, it can be made to expand wider if the 45° degree rule is ignored. For example, an 18.8" pallet in a four crossbeam pattern (as shown in FIGS. 20-27) expands to 14" wide from a 4.0" minimum width.

In one embodiment, no matter how long the tool is made or how wide it can expand, its minimum width when collapsed is approximately 4". Scaling can change this minimum width. It should also be noted that a single double set of crossbeams 56 or just one pair of crossbeams 56 can be used with the center lateral rail 54 removed. Here, there may not be a geared pair of crossbeams 56.

For pick-and-place operations, the islands on the lateral rails are preferably undersized and the front 52, rear 53, and middle 54 lateral rails have slots cut into them at strategic locations corresponding to the under-sizing of the islands. This allows for misfed components to fall through without causing the system to jam when fully collapsed. Components often misfed when placement pick-up heads pick up components, especially smaller components such as resistors and capacitors. It is preferable for the system to be regularly maintained as larger components are not easily displaced nor will they be able to drop through the slots. Regular blasting with air will typically keep the system from getting jammed.

Attaching the scissors pallet 50 to the table 24 may be done with pins or screws or magnets or the like. This is the case even when a standoff system is required under the scissors pallet 50. Attaching to moveable conveyor rails 23 requires that the slide mechanism does not protrude above the maximum pin height requirement. It too can be attached by magnets such as a magnetic chuck.

Figure 25:
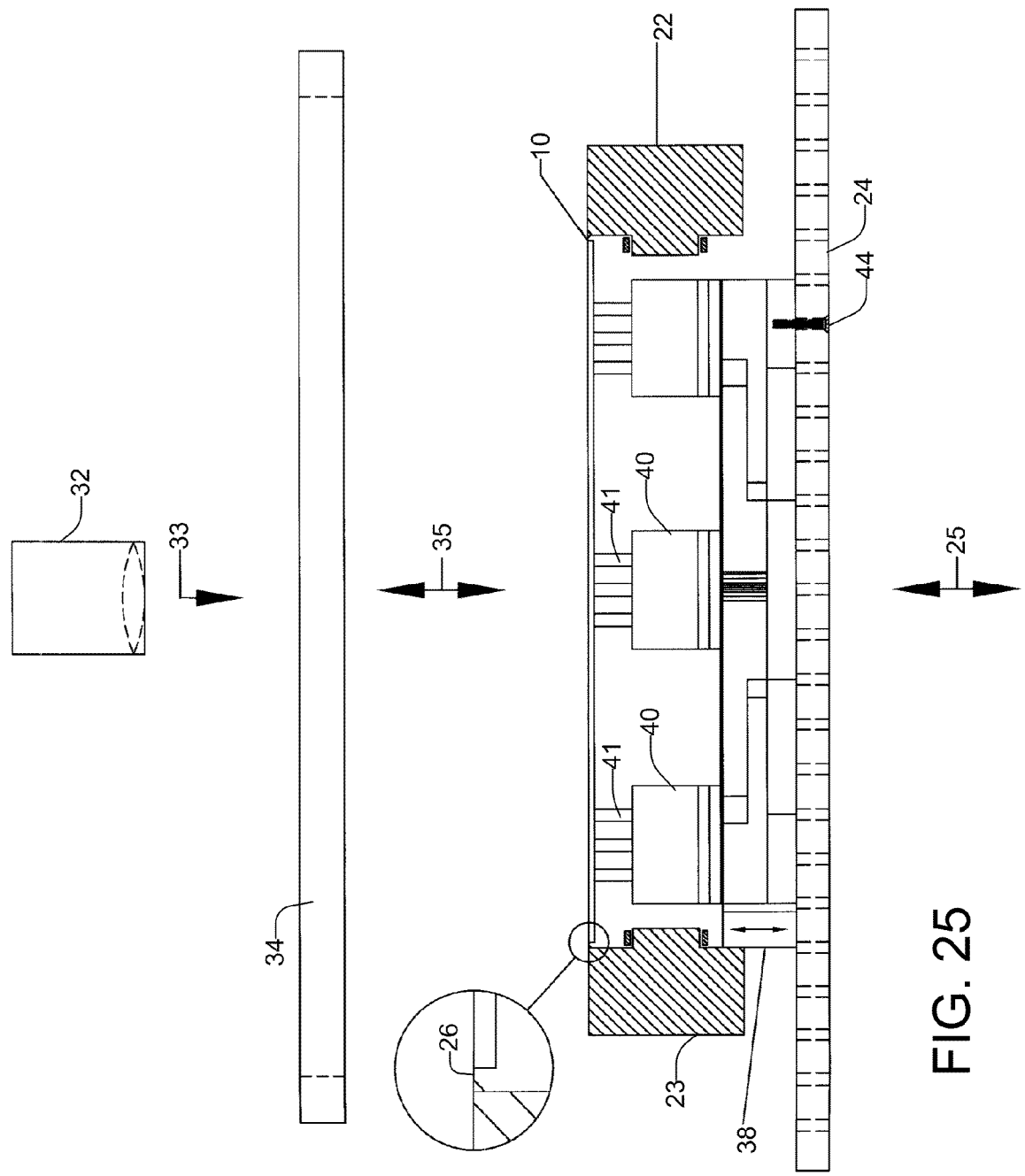
FIG. 25 is a diagram showing a side view of the embodiment shown in FIGS. 19 and 20 implemented with the exemplary integrated conveyor system shown in FIG. 2.
Figure 26:
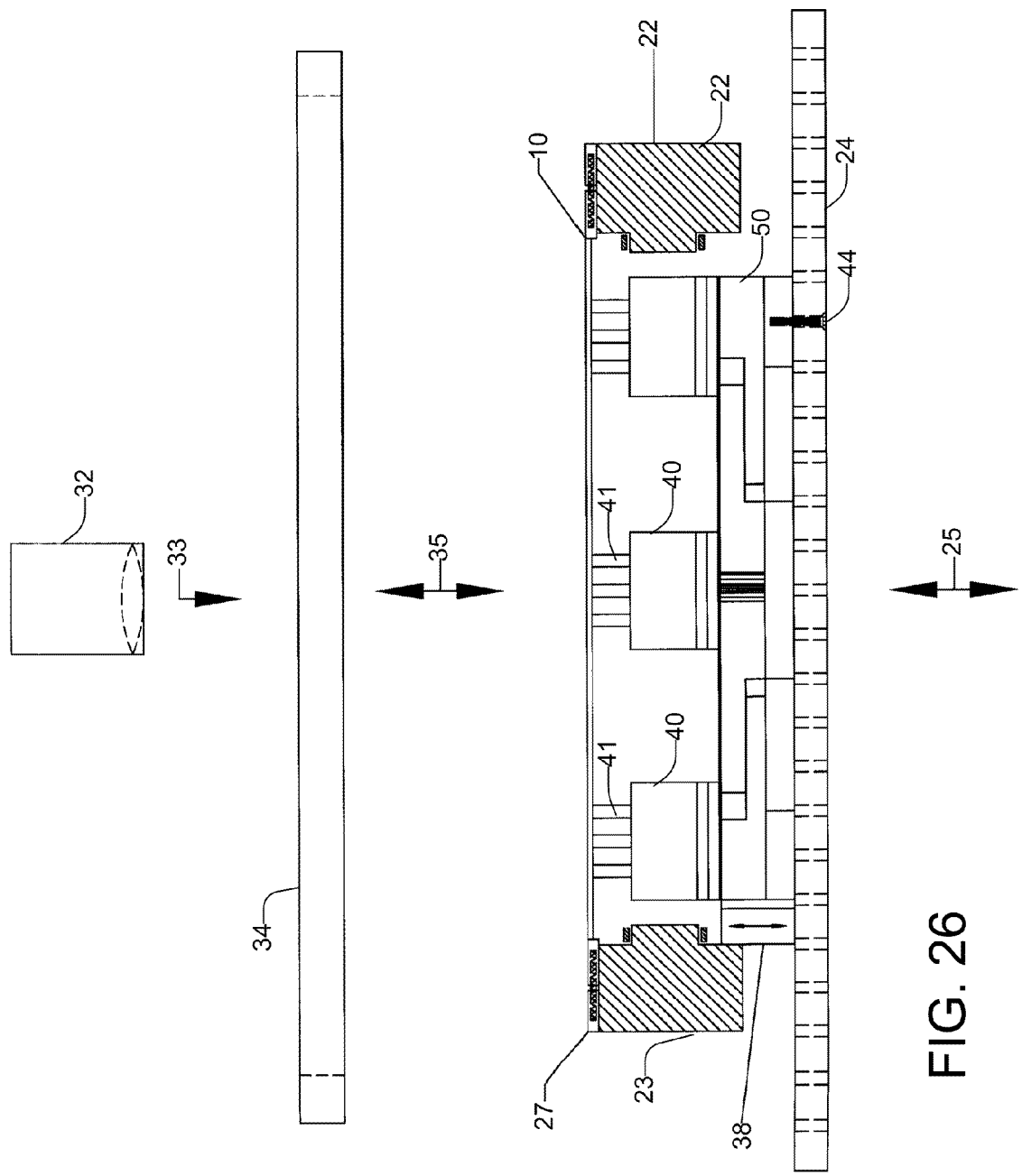
FIG. 26 is a diagram showing a side view of the embodiment shown in FIGS. 19 and 20 implemented with the exemplary integrated conveyor system shown in FIG. 3.
Figure 27:
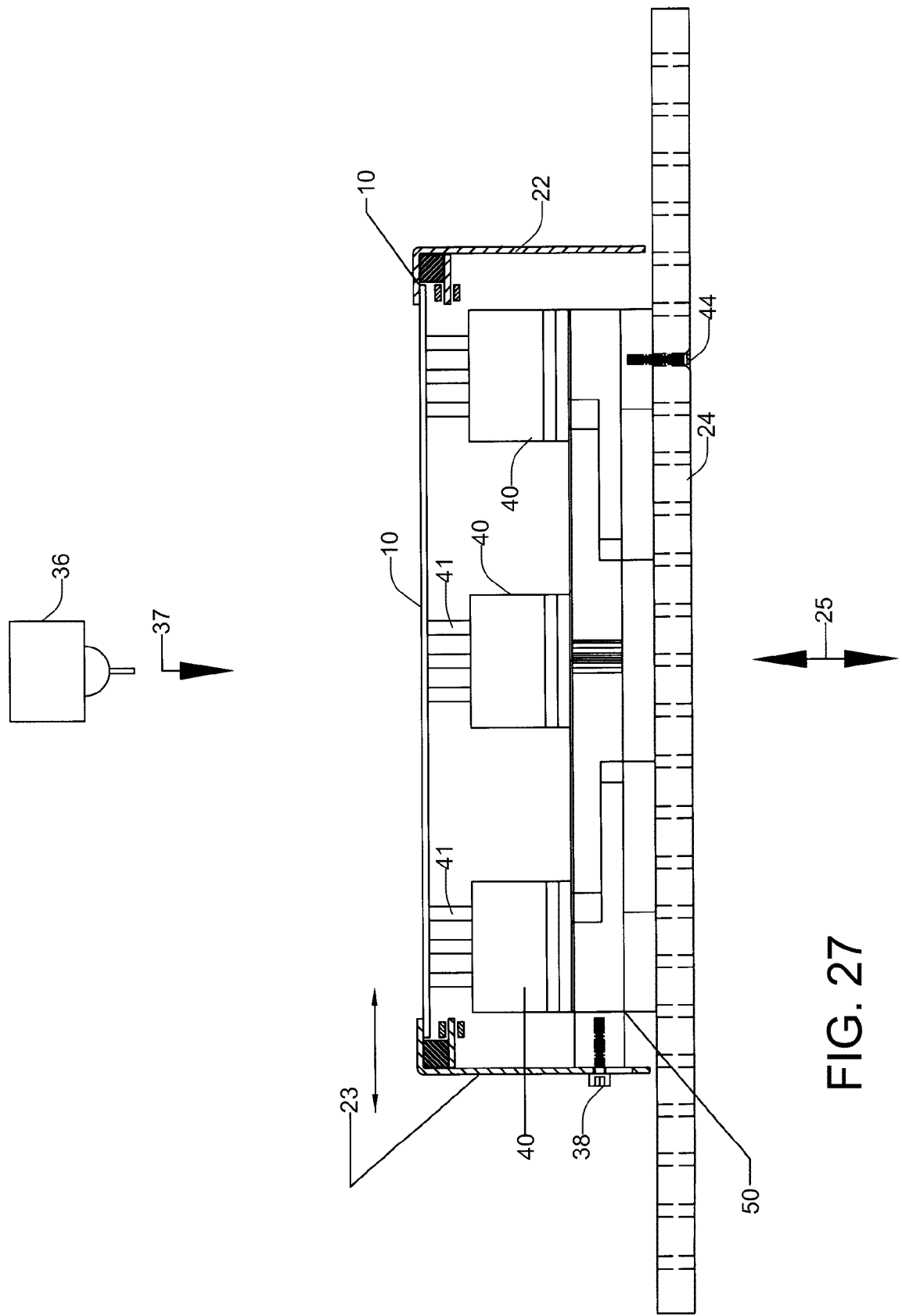
FIG. 27 is a diagram showing a side view of the embodiment shown in FIGS. 19 and 20 implemented with the exemplary integrated conveyor system shown in FIG. 4.
Figure 28:
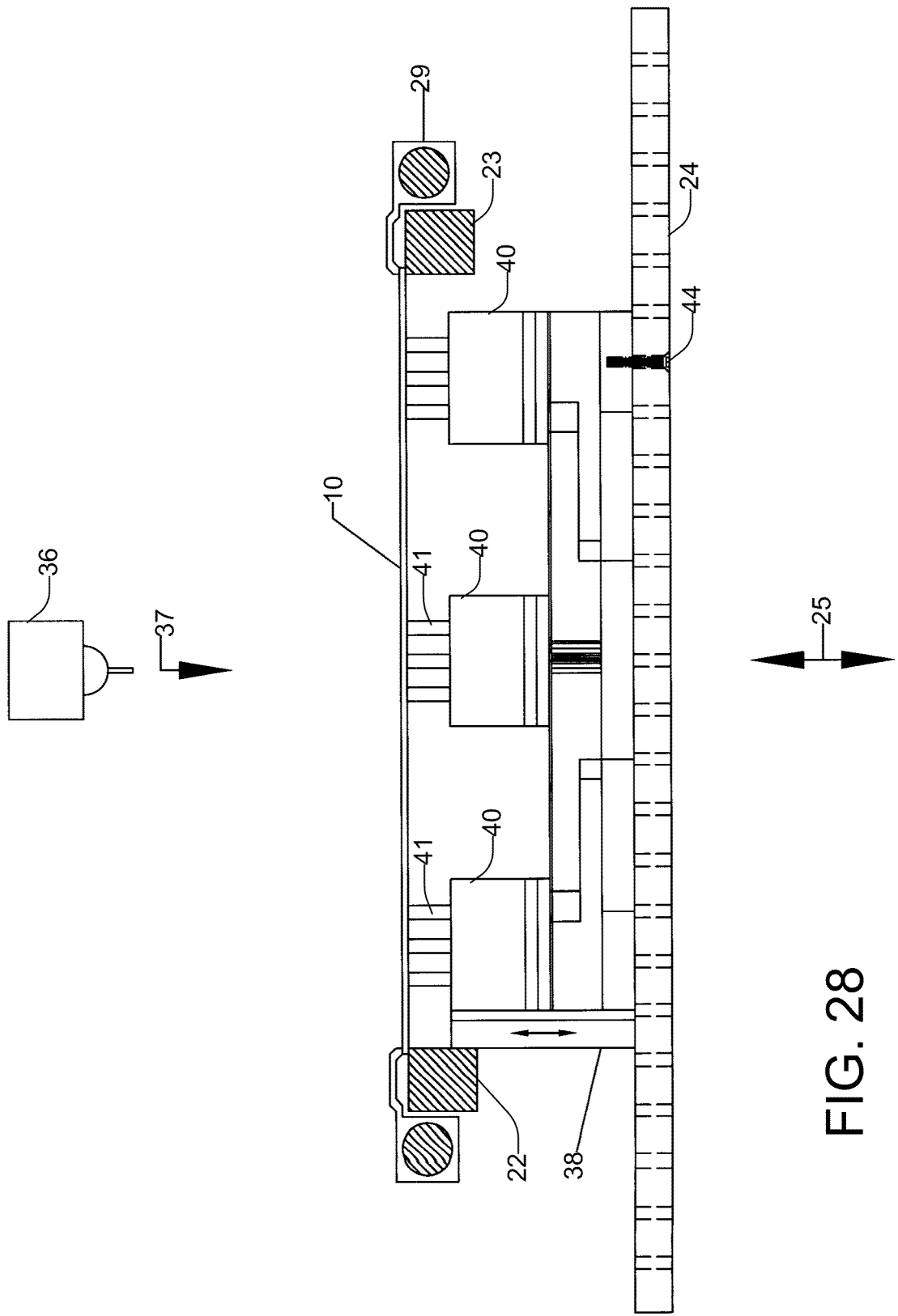
FIG. 28 is a diagram showing a side view of the embodiment shown in FIGS. 19 and 20 implemented with the exemplary integrated conveyor system shown in FIG. 5.

FIGS. 24-28 show side views of the system integrated with the various types of conveyor systems described above and shown in FIGS. 1-5. FIGS. 24a and 24b show the system integrated with MPM's vacuum box printing system with and without the side plates attached. The slide mechanism can be a simple slide system (FIG. 27) or a more sophisticated linear motion slide system (FIGS. 25, 26 & 28).

Traditional Red-E-Set support strips 40 have employed the use of a cam that is typically turned using a T-handle Allen wrench which locks the pins in position. Newer versions have been motorized due to the fact that the machine's work areas are difficult to access by operators. With the simple push of a button the full compliment of Red-E-Set strips are locked simultaneously.

In practice, the scissors pallet 50 is preferably integrated with the machine's table 24 and conveyor rails 22, 23. A minimum number of support strips 40 are then attached to the scissor pallet 50 and plugged into a motor control unit (not shown). The motor control unit may or may not have a remote control. As the conveyor rails' 22, 23 distance apart is increased, the scissors pallet 50 will automatically expand with the conveyor rails 22, 23. This may allow for adding additional support strips 40 onto the pallet 50, which after insertion are also plugged into the motor control unit. When the PCB substrate 10 is moved into position and the table 24 lifts up, the scissors pallet 50 with the support strips 40 will also move up. The support strip pins 41, not yet locked into position, will then engage the topography of the underside of the PCB substrate 10. Additional "top-side" flattening tooling may then be applied that flattens the PCB substrate 10 and the pins may then be locked into position using a motor control box or a remote control. After the pins 41 are locked into place, the machine can then continue on with its operation. PCB substrates 10 will then be shuttled in and out of the machine's integrated conveyor system, which may double as a work-piece holder, and allows for proper underside support. If a new PCB substrate 10 requires the conveyor rails 22, 23 to come closer together, support strips 40 may be removed as necessary, and a new set-up procedure can begin.

In the case of MPM's vacuum box, instead of attaching the scissors pallet 50 to the conveyor rails 22, 23, it would typically be attached to the system's lifting rails 12, 13, or to the table 24 at the fixed front lifting rail 12 and then to the rear lifting rail 13. In this case, no up and down slide mechanisms are typically required since the lifting rails 12, 13 move in tandem with the table 24. As the rear lifting rail 13 is adjusted to the substrate width, the scissors pallet 50 would expand or contract as required.

For batch processes the system may be attached to the rails that hold the substrate and in other instances can merely be attached to the table or even set upon the table without attaching it.

It should be noted that MPM's vacuum system is not always used, and thus, the side plates may not be utilized between the front 12 and rear lifting rail 13. The PCB substrate 10, however, must typically be kept from lifting off with the stencil 34 after paste has been applied and other mechanical systems can be used to prevent this, including vacuum that is more specifically applied or with the use of snuggers 27.

Other Manufacturing Processes

It should be noted that this tooling can be used in other industries and not just the electronics manufacturing industry. Anywhere where work-pieces require support from the underside this type of tooling can be utilized. It is especially beneficial in automated assembly processes and processes where the work-piece has an irregular underside surface and where the top-side requires additional processes that need to be performed on it where the work-piece needs to be flat and level to the machine's inner structures.

Those skilled in the art will recognize that modifications and variations can be made without departing from the spirit of the invention. Therefore, it is intended that this invention encompass all such variations and modifications as fall within the scope of the appended claims.

What is claimed is:

1. A system for manufacturing that provides dynamically adjustable support for work pieces, comprising:
    an edge rail system having a first edge rail, a second edge rail, and a space between the edge rails, wherein the second edge rail is dynamically adjustable, allowing the space between the edge rails to be dynamically adjusted to accommodate various widths of work pieces;
    one or more dynamically adjustable support strips disposed between the edge rails for supporting a lower side of work pieces; and
    a means for dynamically adjusting a space between the one or more dynamically adjustable support strips and the edge rails to compensate for adjustments to the space between the edge rails,
    the dynamic adjustments occurring in a controlled manner and requiring substantially no manual manipulation.

2. The system in claim 1 wherein:
    the set of one or more dynamically adjustable support strips are mounted on a table capable of dynamically changing height.

3. The system in claim 1 wherein:
    the first edge rail is fixed,
    the one or more dynamically adjustable support strips includes:
        a first dynamically adjustable support strip that is effectively fixed in the Y direction in relation to the first edge rail, and
        a second dynamically adjustable support strip that is effectively fixed in the Y direction in relation to the second edge rail; and
    the second dynamically adjustable support strip dynamically adjusts in relation to the first dynamically adjustable support strip as the space between the edge rails is dynamically adjusted.

4. The system in claim 3 wherein:
    the one or more dynamically adjustable support strips are capable of dynamically conforming to a topography disposed on the lower side of the work pieces.

5. The system in claim 3 wherein:
    the means for dynamically adjusting the space between the one or more dynamically adjustable support strips and the edge rails is a scissors pallet.

6. The system in claim 5 wherein:
    the scissors pallet comprises a plurality of islands, wherein the plurality of islands comprises:
        a first island on which the first dynamically adjustable support strip may be mounted;
        a second island on which the second support dynamically adjustable strip may be mounted, and
        a third island located between the first island and the second island on which a third dynamically adjustable support strip may be mounted.

7. The system in claim 6 wherein:
    the one or more dynamically adjustable support strips are removably mounted on pins disposed on the plurality of islands.

8. The system in claim 3 wherein:
    a third dynamically adjustable support strip is located between the first dynamically adjustable support strip and the dynamically adjustable second support strip; and
    a position of the third dynamically adjustable support strip is dynamically adjustable in relation to the first dynamically adjustable support strip and the second dynamically adjustable support strip.

9. The system in claim 8 wherein:
the dynamic adjustment of the third dynamically adjustable support strip utilizes at least one of a set consisting of a screw drive and a geared rack.

10. The system in claim 1 wherein:
the work pieces are printed circuit boards, and
the system comprises at least one operation from a set consisting of:
  substrate printing; and
  pick-and-place.

* * * * *